United States Patent
Michal et al.

(10) Patent No.: US 10,320,297 B2
(45) Date of Patent: Jun. 11, 2019

(54) BODY-DIODE CONDUCTION DETECTOR FOR ADAPTIVE CONTROLLING OF THE POWER STAGE OF POWER CONVERTERS

(71) Applicant: Infineon Technologies AG, Neubiberg (DE)

(72) Inventors: Vratislav Michal, Villach (AT); Matteo Agostinelli, Villach (AT); Volha Kharko Subotskaya, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/793,081

(22) Filed: Oct. 25, 2017

(65) Prior Publication Data
US 2019/0123653 A1 Apr. 25, 2019

(51) Int. Cl.
*H02M 3/158* (2006.01)
*H02M 1/38* (2007.01)
(Continued)

(52) U.S. Cl.
CPC ........... *H02M 3/1588* (2013.01); *H02M 1/38* (2013.01); *H02M 3/33592* (2013.01);
(Continued)

(58) Field of Classification Search
CPC ...... H02M 3/156; H02M 3/155; H02M 3/158; H02M 3/1582; H02M 3/157
(Continued)

(56) References Cited

U.S. PATENT DOCUMENTS

| 8,013,586 B2 * | 9/2011 | Tlaskal | H02M 1/38 323/282 |
| 8,111,051 B2 * | 2/2012 | Sakai | H02M 3/1588 323/224 |

(Continued)

OTHER PUBLICATIONS

"UCD7138 4-A and 6-A Single-Channel Synchronous-Rectifier Driver With Body Diode Conduction Sensing and Reporting" TI datasheet, www.ti.com, Mar. 2015, Revised May 2015, 36 pp.
(Continued)

*Primary Examiner* — Nguyen Tran
(74) *Attorney, Agent, or Firm* — Shumaker & Sieffert, P.A.

(57) ABSTRACT

A circuit to detect body diode conduction in a switch with an adaptive dead-time scheme for a switched mode power supply. The body-diode of a first switch entering conduction means the first switch is OFF and a second switch can be turned ON. The body diode conduction detector circuit (BDCD) uses relative analysis of the switching node voltage ($V_{LX}$). The BDCD circuit acts as a voltage follower in a first phase and a comparator in a second phase. The BDCD circuit tracks $V_{LX}$ during the first phase and samples and holds $V_{LX}+V_{REF}=V_{HOLD}$ at the end of the first phase. During the second phase, the BDCD circuit compares $V_{LX}+V_{HOLD}$ to $V_{REF}$. When the body-diode of the first switch enters conduction $V_{LX}$ will become negative and $V_{LX}+V_{HOLD}$ will drop below $V_{REF}$, and toggle the logic level output of the comparator.

18 Claims, 12 Drawing Sheets

(51) Int. Cl.
 *H02M 3/335* (2006.01)
 *H02M 1/00* (2006.01)
 *H02M 1/36* (2007.01)
 *H03K 17/16* (2006.01)

(52) U.S. Cl.
 CPC ...... *H02M 1/36* (2013.01); *H02M 2001/0009* (2013.01); *H02M 2001/0048* (2013.01); *H02M 2001/385* (2013.01); *H03F 2200/351* (2013.01); *H03K 17/165* (2013.01)

(58) Field of Classification Search
 USPC .................................. 323/222, 271, 282–285
 See application file for complete search history.

(56) References Cited

U.S. PATENT DOCUMENTS

| | | | |
|---|---|---|---|
| 8,971,077 B2* | 3/2015 | Nakamoto | G05F 1/468 323/285 |
| 9,236,809 B2 | 1/2016 | Wang | |
| 2008/0197887 A1* | 8/2008 | Uchida | H03F 3/45475 327/72 |

OTHER PUBLICATIONS

Michal, et al. "Time Domain CCM/DCMI Boundary Detector with Zero Static Power Consumption for Integrated High-Efficiency Step-down DC/DC Converters", Sep. 2016 IEEE International Conference on Applied Electronics, 4 pp.

\* cited by examiner

US 10,320,297 B2

BODY-DIODE CONDUCTION DETECTOR FOR ADAPTIVE CONTROLLING OF THE POWER STAGE OF POWER CONVERTERS

TECHNICAL FIELD

The disclosure relates to switched mode power converters.

BACKGROUND

The control signal for a switched mode power supplies may include some dead time between the signals that turn on the high side and low side switches. The dead time may avoid cross-conduction, which could damage the power stage. A fixed dead time may be selected to ensure a switch is completely off before the other switch is turned on. The fixed dead time may include a safety margin that accounts for differences in a circuit application as well as switch variation from manufacturing tolerances. A dead time that is longer than needed may be responsible for power loss and lower efficiency.

SUMMARY

In general, the disclosure is directed to a circuit to detect body diode conduction in a switch. By detecting the body diode conduction, a controller for a switched mode power supply may include an adaptive dead-time scheme. The body diode conduction detector circuit of this disclosure provides a relative analysis of the switching node voltage ($V_{LX}$). With the relative analysis, the body diode conduction detector (BDCD) circuit may determine the sign of the derivative of $V_{LX}$ voltage without the need for an absolute voltage measurement.

The BDCD circuit operation of this disclosure is based on at least two phases. During a first phase, the BDCD circuit tracks $V_{REF}$ during the low-side (LS) switch conduction cycle. When the LS switch is conducting, $V_{LX}$ approximately equals $V_{DS}$ of the LS switch. The end of the LS conduction cycle is the end of the first phase. At the end of the LS switch conduction cycle, the BDCD circuit samples and holds the drain-source voltage $V_{DS}$ of the LS switch plus the reference voltage $V_{REF}$, where $V_{REF}$ is an arbitrary reference voltage: $V_{DS}+V_{REF}=V_{HOLD}$. During a second phase, i.e. during the non-overlapping phase, the BDCD circuit evaluates the behavior of $V_{LX}+V_{HOLD}$, which is then compared to the reference voltage $V_{REF}$. The example BDCD circuit contains an operational amplifier that acts as a voltage follower in the first phase and as a comparator in the second phase.

When the body-diode of the LS switch enters into conduction $V_{LX}$ will become more negative than $V_{DS}$ and the derivative of $V_{LX}$ is then negative. As a result, $V_{LX}+V_{HOLD}$ will begin to decrease and $V_{LX}+V_{HOLD}$ will drop below $V_{REF}$, causing the output of the comparator to indicate that the LS switch body-diode is entering in conduction. The LS switch body-diode entering conduction means the LS switch is OFF and high-side (HS) switch can be turned ON.

In one example the disclosure is directed to a circuit comprising: a capacitor configured to store a voltage at the end of a first phase, wherein the stored voltage comprises a sum of an input voltage plus a reference voltage, and an operational amplifier configured to: follow the reference voltage during the first phase, compare a sum of the input voltage plus the stored voltage to the reference voltage during a second phase, and in response to a magnitude of the sum of the input voltage plus the stored voltage being greater than the magnitude of the reference voltage, toggle an output signal of the operational amplifier from a first logic level to a second logic level.

In another example, the disclosure is directed to a method comprising: configuring a first portion of a circuit as a voltage follower, wherein an output signal at an output element of the first portion of the circuit is configured to track a reference voltage, tracking the reference voltage during a first phase of circuit operation, wherein the first phase comprises a beginning and an end, storing, by a second portion of the circuit at the end of the first phase, a voltage, wherein the stored voltage comprises the sum of an input voltage plus the reference voltage.

In another example, the disclosure is directed to a system comprising: a controller circuit configured to drive a power stage of a switched mode power supply. The controller circuit comprising: a driver element configured to drive at least one switch of the power stage, a body diode conduction detector (BDCD) circuit comprising: a capacitor configured to store a voltage at the end of a first phase, wherein the stored voltage comprises the sum of a reference voltage plus a switching node voltage of the power stage. The system further comprises an operational amplifier configured to: during the first phase, follow the reference voltage. During a second phase: compare the sum of the stored voltage plus the switching node voltage to the reference voltage, and in response to the sum of the switching node voltage plus the stored voltage being more negative than the reference voltage, toggle an output signal of the operational amplifier from a first logic level to a second logic level.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
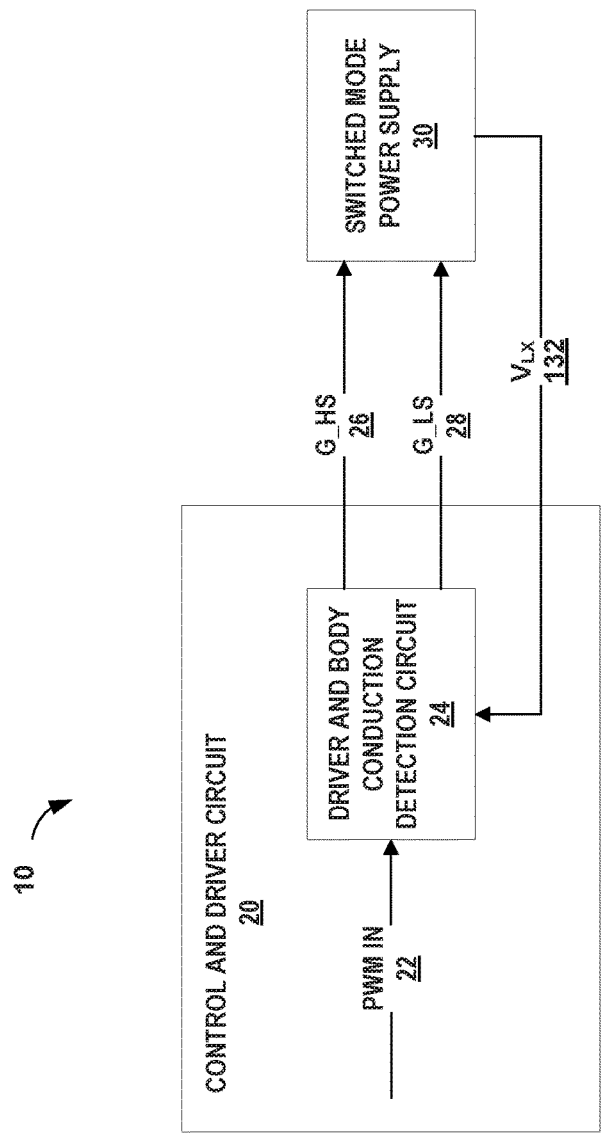
FIG. 1 is a block diagram illustrating an example circuit configured to control the power stage of a switched mode power supply that contains a BDCD circuit in accordance with one or more techniques of this disclosure.

The disclosure is directed to a circuit to detect body diode conduction in a switch. By detecting the body diode conduction, a controller for a switched mode power supply may include an adaptive dead-time scheme. The body diode conduction detector circuit of this disclosure detects body diode conduction by a relative analysis of the switching node voltage ($V_{LX}$). With the relative analysis, the body diode conduction detector (BDCD) circuit may determine the sign of the derivative of $V_{LX}$ voltage without the need for an absolute voltage measurement.

The BDCD circuit operation of this disclosure is based on two phases. During a first phase, the BDCD circuit tracks $V_{REF}$ during the low-side (LS) switch conduction cycle $\Phi_1$. When the LS switch is conducting, $V_{LX}$ approximately equals $V_{DS}$ of the LS switch. The end of the LS conduction cycle is the end of the first phase. At the end of the LS switch conduction cycle, the BDCD circuit samples and holds the drain-source voltage $V_{DS}$ of the LS switch plus the reference voltage $V_{REF}$, where $V_{REF}$ is an arbitrary reference voltage: $V_{DS}+V_{REF}=V_{HOLD}$. During a second phase $\Phi_2$, i.e. during the non-overlapping phase, the BDCD circuit evaluates the behavior of $V_{LX}+V_{HOLD}$ is compared to a reference voltage $V_{REF}$. The BDCD circuit contains an operational amplifier that acts as a voltage follower in the first phase and as a comparator in the second phase.

When the body-diode of the LS switch enters into conduction $V_{LX}$ will become more negative and the derivative of $V_{LX}$ is negative. $V_{LX}+V_{HOLD}$ will begin to decrease and will drop below $V_{REF}$, causing the output of the comparator to indicate that the body-diode of the LS switch is beginning to conduct current. The LS switch body-diode entering conduction means the LS switch is OFF and high-side (HS) switch can be turned ON without damaging the power stage.

A controller with an adaptive dead-time scheme may be able to control a wide variety of power transistors regardless of transistor type or variation from manufacturing process or environmental conditions. By enabling aggressive timing scheme, such a controller may provide high efficiency while still preventing damage to the power stage. Additionally, such a controller may improve reliability of power transistors by minimizing the reverse recovery charge, e.g. short charge accumulation time in the substrate. A BDCD circuit may only need to measure the switching node voltage, which may be a simplified scheme when compared to more complex power transistor status detection circuits that may determine whether a power transistor is ON, OFF or in some other state.

The body diode conduction detector circuit of this disclosure may overcome the issues associated controlling a power stage that is on a separate circuit from the BDCD circuit. In some examples, the power stage circuit may include discrete power transistors. In other examples, the power stage circuit may be on a separate integrated circuit (IC) than the body diode conduction detector circuit. Accurately sensing body diode conduction may be difficult in part because the ground of the sensing IC that includes the BDCD circuit may be different from the power ground of the power stage circuit, which may make simple voltage measurements unreliable. When the power stage circuit and the sensing IC are mounted to a printed circuit board (PCB), bonding between the pins of the sensing IC and PCB pads, as well as other parasitic elements on a PCB may affect voltage, timing and other measurements. Additionally, the switching node may contain high-frequency resonances and other high-frequency noise, such as from the system power supply (e.g. $V_{PWR}$ or $V_{DD}$), that makes the detection difficult. By sensing relative voltage, rather than absolute voltage, the BDCD circuit of this disclosure may accurately sense body diode conduction of a power stage on a separate IC. Other advantages of the BDCD circuit of this disclosure, such as fast detection speed on the order of one nanosecond (ns), will be described in more detail below.

FIG. 1 is a block diagram illustrating an example circuit configured to control the power stage of a switched mode power supply that contains a BDCD circuit in accordance with one or more techniques of this disclosure. The circuit components of system 10 may be implemented on a single IC, two or more ICs or a combination of IC and discrete components.

System 10 may include a control and driver circuit 20, a switched mode power supply 30 and the connections between the control and driver circuit 20 and power supply 30. System 10 may provide power for a variety of circuits including a microprocessor, microcontroller, or any other load that may be supplied by a switched mode power supply.

Switched mode power supply 30 (SMPS 30) may include sub-circuits such as a power stage sub-circuit that may perform rectification and filtering and an output sub-circuit, which may include additional filtering (not shown in FIG. 1). Some examples of switched mode power supplies include a DC-DC converter and a flyback converter.

Control and driver circuit 20 may receive a pulse width modulated (PWM) input signal 22 and may include a driver and BDCD circuit 24. PWM input signal may control the output voltage and current of SMPS 30 by controlling the output of the driver portion of driver and BDCD circuit 24. In some examples, control and driver circuit 20 may also include a dead-time generator circuit to protect the power stage from damage by ensuring both the high side and low side switches do not turn on at the same time, i.e. cross-conduction.

Driver and BDCD circuit 24 may be considered a controller circuit configured to drive a power stage of a switched mode power supply, such as SMPS 30. Driver and BDCD circuit 24 may include a driver element configured to drive at least one switch of the power stage. That is, driver and BDCD circuit 24 may control SMPS 30 by outputting a high side gate signal (G_HS 26) and a low side gate signal (G_LS 28). Driver and BDCD circuit 24 may receive a feedback signal that monitors to switching node voltage ($V_{LX}$ 132). As described above, driver and BDCD circuit 24 may sense relative voltage of $V_{LX}$ 132, to accurately sense body diode conduction of the power stage sub-circuit of SMPS 30, which may be implemented as a discrete power transistor circuit or on a separate IC.

The configuration of system 10 may provide self-adaptive control of the power stage driver, such as control and driver circuit 20, which may be configured to handle a wide variety of discrete external devices, such as power transistors. By sensing the body diode conduction, system 10 may enable a more aggressive timing scheme than implementing a fixed dead-time scheme. The more aggressive timing scheme may provide an improved efficiency over a power stage driver circuit with a fixed dead-time scheme. An additional advantage may include a simplified interaction between control and driver circuit 20 and SMPS 30, by receiving the switching node voltage $V_{LX}$ 132, rather than a more complicated control scheme. In some examples, the body diode of this disclosure may be a parasitic component of a power transistor, such as a metal oxide semiconductor field effect transistor (MOSFET), and insulated gate bipolar junction transistor (IGBT), or similar power transistor.

Figure 2:
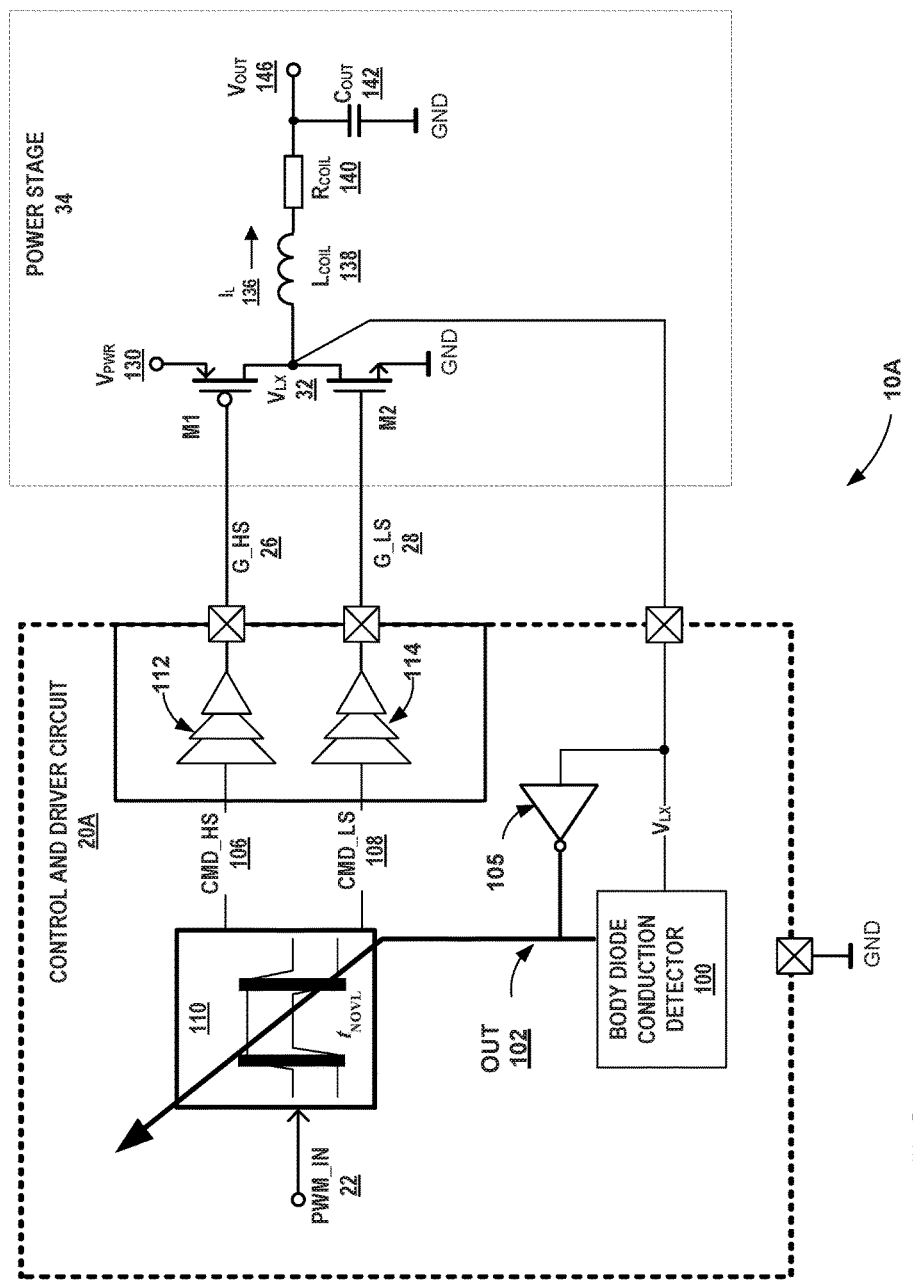
FIG. 2 is a schematic diagram illustrating an example circuit configured to control the power stage of a switched mode power supply that contains a BDCD circuit in accordance with one or more techniques of this disclosure.

FIG. 2 is a schematic diagram illustrating an example circuit configured to control the power stage of a switched mode power supply that contains a BDCD circuit in accordance with one or more techniques of this disclosure. System 10A is one example implementation of the techniques of this disclosure. In other examples, a control and driver circuit according to this disclosure may include more or fewer components and may include other arrangements not shown in FIG. 2. To simplify the explanation, this disclosure may focus on a SMPS DC to DC converter with a buck power stage, i.e. an LC-DC-DC step-down converter. However, the techniques of this disclosure may apply to any gate driver circuit for switch-mode converters, with available switching node voltage feedback.

System 10A may function in a similar manner to system 10 described above in relation to FIG. 1. System 10A may include a power stage 34, which may be a sub-circuit of a switched mode power supply, such as SMPS 30 described above. Power stage 34 may be controlled by control and driver circuit 20A, similar to the function of control and driver circuit 20 described above.

Power stage 34 is one example implementation of a power stage of a SNIPS. Other examples of a power stage may include different components in different arrangement than depicted in FIG. 2. In the example of FIG. 2, power stage 34 includes a PMOS high side (HS) switch M1 and an NMOS low side (LS) switch M2. The source of LS switch M2 connects to ground and the drain of LS switch M2 connects to the drain of HS switch M1 at switching node 32. The voltage at switching node 32 is $V_{LX}$. The source of HS switch M1 connects to the power stage power $V_{PWR}$ 130.

Switching node 32 connects to a first terminal of inductor 138 ($L_{COIL}$ 138) and the second terminal of inductor 138 connects to output $V_{OUT}$ 146 through resistor 140 ($R_{COIL}$ 140). In some examples, resistor 140 may represent the parasitic, or inherent resistance of inductor 138, rather than a separate resistor. $V_{OUT}$ 146 connects to ground through output capacitor 142 ($C_{OUT}$ 142). The inductor current $I_L$ 136 flows through inductor 138 and resistor 140.

Power stage 34 provides a feedback signal to controller and driver circuit 20A of the voltage $V_{LX}$ at switching node 32. HS switch M1 receives a gate control signal G_HS 26 from HS driver 112. LS switch M2 receives a gate control signal G_LS 28 from LS driver 114.

Control and driver circuit 20A may receive a PWM signal PWM_IN 22 from a processor or other controller that determines the voltage or current output of the SMPS, such as SMPS 30 depicted in FIG. 1. Control and driver circuit 20A may be connected to ground, and receive other inputs not shown in FIG. 2, such as $V_{DD}$, a temperature sense signal, or other similar sense or control signals. Control and driver circuit 20A may include dead-time generator 110, a driver circuit, and BDCD 100.

BDCD 100 receives $V_{LX}$ from power stage 34 and outputs a signal to dead-time generator 110 at output element, out 102. In some examples, the output signal of the BDCD 100 may control dead-time generator 110. In other examples, the output element of BDCD 100 may bypass or override the driver control signals CMD_HS 106 and CMD_LS 108 to control switches M1 and M2. When the body-diode of the LS switch enters into conduction $V_{LX}$ will become negative and the derivative of $V_{LX}$ is negative. BDCD 100 may accurately detect when the body-diode of LS switch M2 is beginning to conduct current. The body-diode of LS switch M2 entering conduction means LS switch M2 is OFF and HS switch M1 can be turned ON without damaging the power stage.

In some examples, the signal to dead-time generator 110 may include the inverse of the switching node voltage, $V_{LX}$, through inverter 105, for detecting the falling edge of $V_{LX}$. Dead-time generator 110, may also be considered a non-overlapping signal generator. Dead-time generator 110 may receive the control information from PWM_IN 22, along with the timing information from BDCD 100 and output control signals to the driver circuits. In the example of FIG. 2, the driver control signals may include CMD_HS 106 and CMD_LS 108. The driver circuits, HS driver 112 and LS driver 114, may output gate control signals G_HS 26 and G_LS 28 to power stage 34.

In operation, system 10 may be more efficient than a power stage control circuit with the dead-time is set to a fixed value. The techniques of this disclosure with the adaptive schematic such as control and driver circuits 20 and 20A, may use two sensors, to detect the falling and rising edge of $V_{LX}$ voltage. This detection will be described in more detail in relation to FIGS. 3 and 4 below.

In some examples, power stage 34 may be implemented on the same IC as control and driver circuit 20A. Therefore, switches M1 and M2 may be considered "internal switches." The properties, such as $R_{ON}$, for internal switches may be accurately defined. Measurements of the same IC, such as of $V_{DS}$ of M1 and M2, may also be free of voltage noise (spikes, resonances etc.). Therefore, body diode conduction may be detected by a voltage sensing $V_{LX}$ of switching node 32. One possible technique for internal switches may include a common gate differential pair, allowing the sensing below GND. In some examples, for internal switches, body-diode sensing may be accurately replaced by the gate-voltage sensing.

However, one advantage of the techniques of this disclosure is that the sensing circuit may be used in examples in which power stage 34 is separate from the sensing IC. Control and driver circuit 20A may be implemented on a single IC that in some examples may be separate from power stage 34. In this example, switches M1 and M2 may be considered "external switches." The power stage circuit, power stage 34 and the sensing IC, control and driver circuit 20A may be mounted to a PCB. The bonding between the pins of the control and driver circuit 20A and PCB pads, as well as other parasitic elements on a PCB may affect voltage, timing and other measurements. Bonds between the components of power stage 34 and the PCB may also include parasitic elements such as resistance, inductance and capacitance that may impact sensing and circuit performance.

In manufacturing, the $R_{ON}$ of power transistors used as external switches may not be well controlled, or may not be available to the sensing circuit, such as control and driver circuit 20A. Also, the GND of the sensing circuit may be different from the power ground of the power stage, therefore simple direct voltage measurements of the switching node and other nodes may not be reliable. Moreover, because of PCB bonding and other parasitic elements, the switching node may contain high-frequency resonances and other high-frequency noise that makes the detection difficult. The BDCD circuit of this disclosure, such as BDCD 100, may detect body diode conduction by a relative analysis of switching node voltage 32 ($V_{LX}$). With the relative analysis, discussed in more detail below, the body diode conduction detector (BDCD) circuit may determine the sign of the derivative of $V_{LX}$ without the need for an absolute voltage measurement.

Figure 3A:
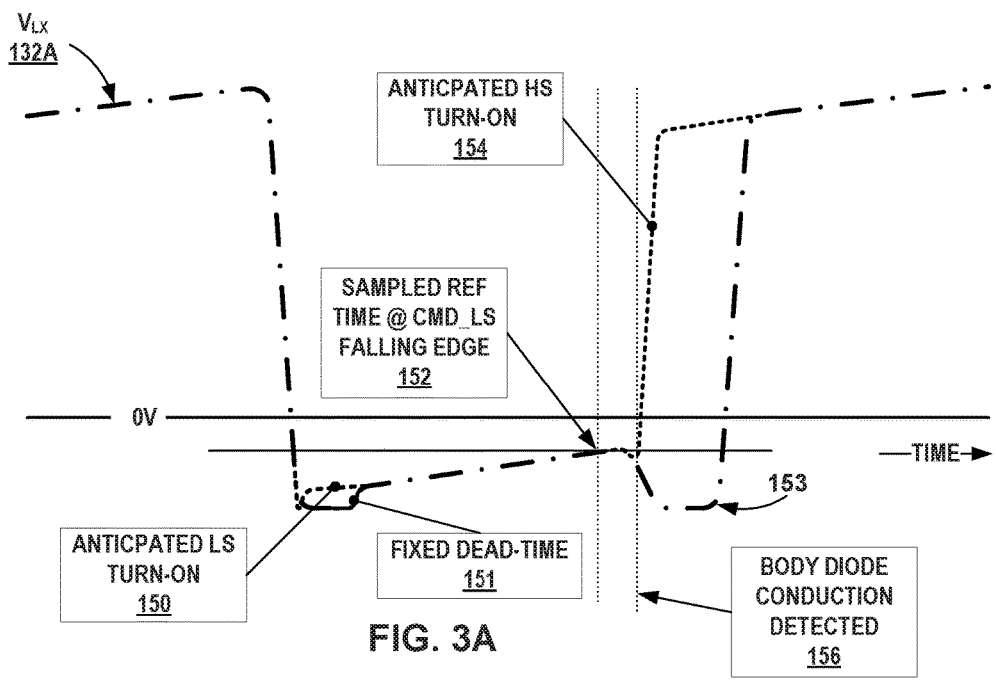
FIGS. 3A and 3B are timing graphs illustrating the operation of a controller circuit configured to control a switched mode power supply.
Figure 3B:
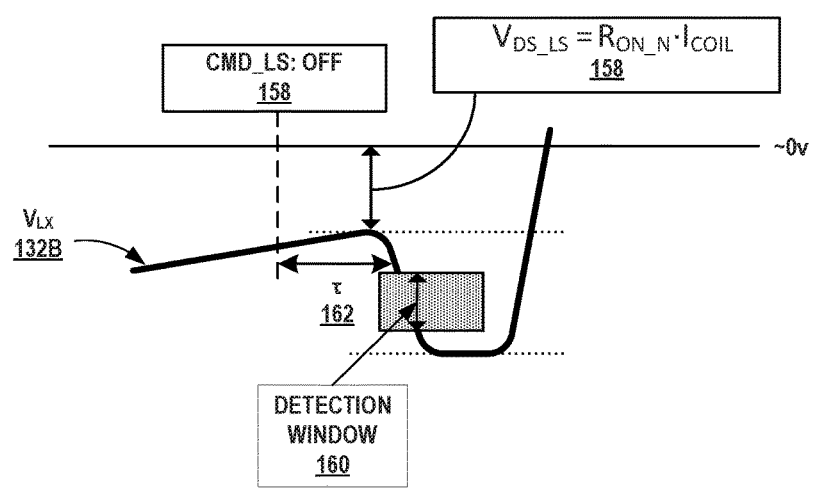

FIGS. 3A and 3B are timing graphs illustrating the operation of a controller circuit configured to control a switched mode power supply. FIG. 3B shows more detail of the detection window operation of a BDCD circuit of this disclosure.

FIG. 3A depicts a waveform of the switching node $V_{LX}$ delivering positive output current (i.e. positive inductor current $I_{COIL}$) during the LS switch conduction cycle. The waveform of FIG. 3A may simplified to ignore parasitics, noise or other similar factors. In circuits without the BDCD circuit of this disclosure, a long dead-time phase may be needed to avoid cross-conduction and damaging the power stage. The dead-time may result in lower efficiency from power loss, described in more detail below in relation to FIG. 6.

Before the LS switch conduction cycle, $V_{LX}$ 132A transitions from high to low as the HS switch, such as HS switch M2 turns OFF. The fixed dead time curve 151, depicts a dead time before the LS switch, such as LS switch M2, turns ON. Fixed dead time curve 151 depicts a second dead-time 153 after LS switch M2 is turned off, before $V_{LX}$ goes high as HS switch M1 turns on again.

By monitoring $V_{LX}$ 132A, a power stage controller, such as control and driver circuit 20A, may anticipate the turn on of LS switch M2 (150) by detecting the falling transition via an inverter connected to switching node 32, such as inverter 105. The falling transition may be detected by an inverter with the switching point close to GND, e.g. near the switch threshold voltage ($V_{TH}$). When the sensing circuit, such as control and driver circuit 20A, detects the fall transition, dead-time generator 110 may immediately enable LS switch M2 (150).

The second transition 152 may be more complicated, because in the case of positive inductor current, the switching node $V_{LX}$ may change from some unknown negative voltage $V_{DS}$ of LS switch M2 (in some examples ~100 mV) to a forward diode voltage. The forward diode voltage of LS switch M2 may be approximately 300 mV for Schottky body diode and −600 mV for silicon body diode. Moreover, the absolute value (position) of GND is may unknown in the chip, and voltage spikes, such as from resonances, may occur during the transition. These three effects complicate the detection of body diode conduction. One advantage of the control and driver circuit with BDCD 100 according to techniques of this disclosure includes being able to control a variety of power transistors (e.g. Schottky, silicon, IGBT and other types).

Control and driver circuits 20 and 20A of this disclosure may determine LS switch body diode conduction 156, and combined with the timing of the CMD_LS falling edge signal 152, may determine when LS switch M2 turns off. Control and driver circuits 20 may anticipate LS switch M2 turn off and turn on HS switch M1 (154) with a short dead-time, when compared to dead-time 153.

FIG. 3B depicts a switching-node waveform $V_{LX}$ 132B at switch turn-off event of the low-side switch conduction cycle, which illustrates the difficulty of detecting LS switch body-diode conduction. FIG. 3B may be simplified to ignore parasitics, noise or other similar factors. In examples in which a power stage, such as power stage 34 may be implemented on the same IC as control and driver circuit, the properties, such as $R_{ON}$, for internal switches may be accurately defined, as described above. Measurements may be free of voltage noise and body diode conduction may be detected by a voltage sensing of the absolute voltage $V_{LX}$ of switching node 32. As described above, a possible technique for internal switches may include a common gate differential pair, allowing the sensing below GND. In some examples, for internal switches, body-diode sensing may be accurately replaced by the gate-voltage sensing.

Therefore, for internal switches, the sensing circuit may accurately define detection window 160. Also, the sensing circuit may accurately determine timing for the OFF command from CMD_LS (158), as well as the timing 162 (τ) between the OFF command 158 and detection window 160. Because the $R_{ON}$ of internal switches may be well controlled, and known to the sensing circuit, in one example, the sensing circuit may accurately determine $V_{DS}$ of LS switch M2, depicted in power stage 34, according to the below equation (158):

$$V_{DS\_LS} = R_{ON\_N} \times I_{COIL}$$

However, for external switches, as described above, $R_{ON\_N}$ is unknown and also the ground between the sensing circuit and power stage may be different, resulting in an inaccurate determination by the sensing circuit of what is zero volts. The inaccurate ground makes an absolute voltage measurement inaccurate. Also, for external switches, the detection window 160 may have an undefined voltage range and noise from the unknown $R_{ON\_N}$, and from other parasitics and ground offset. These challenges may result in a long detection time. Some examples of body diode detection circuits may have detection thresholds ($V_{TH}$) on the order of approximately 115 mV and detection times on the order of 30 ns. The techniques of this disclosure, described in more detail below, use a relative voltage analysis as one technique to overcome these challenges.

Figure 4:
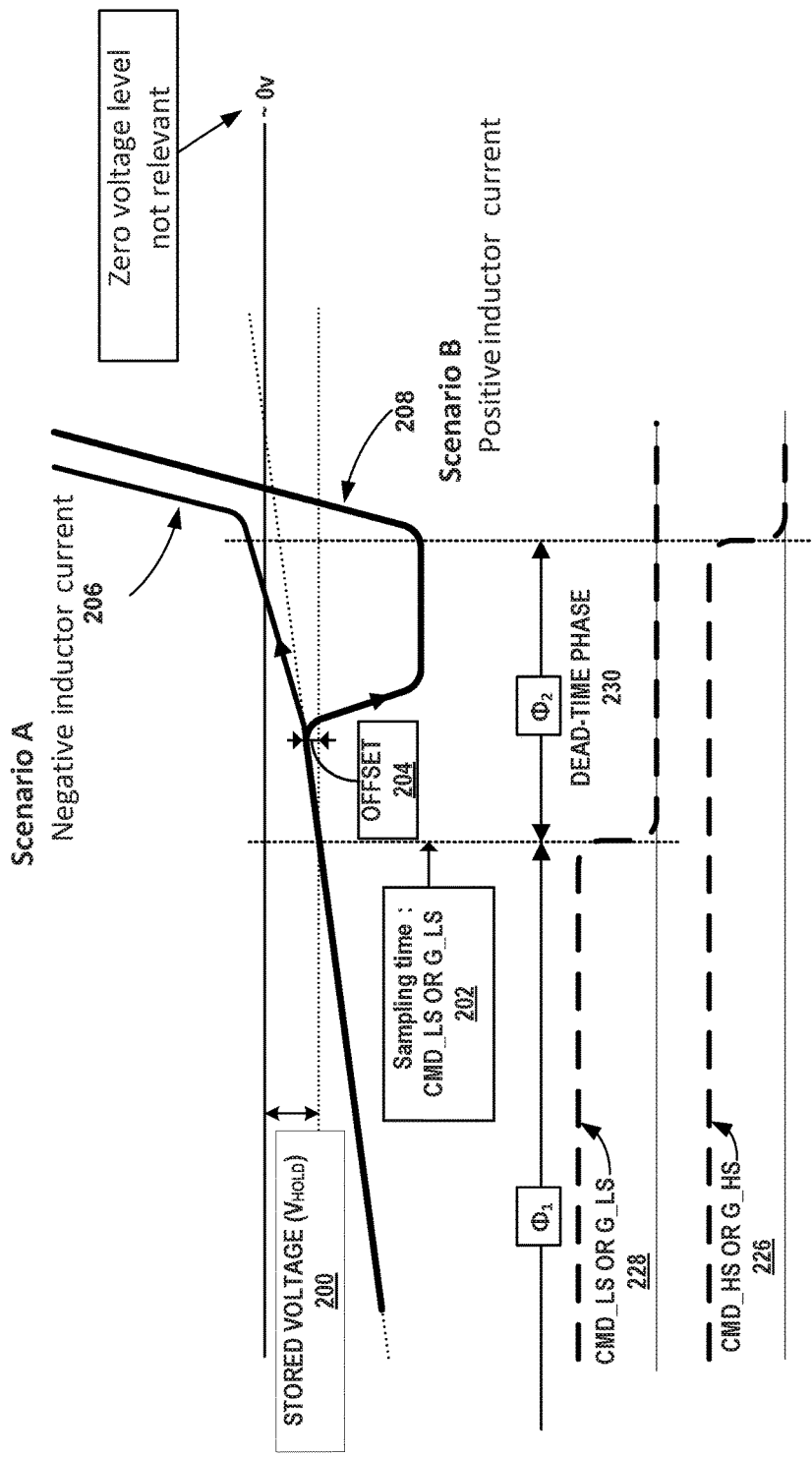
FIG. 4 is a timing graph illustrating the operation of a BDCD circuit in accordance with one or more techniques of this disclosure.

FIG. 4 is a timing graph illustrating the operation of a BDCD circuit in accordance with one or more techniques of this disclosure. As shown in FIG. 4, the operation of a BDCD circuit of this disclosure is based on the sampling and storing the switching node voltage at the end of LS switch conduction cycle. Based on this stored voltage, the BDCD circuit evaluates the behavior of $V_{LX}$ in remaining time, i.e. during non-overlapping phase.

In some examples, two possibilities may occur for the switching node voltage behavior. In scenario A (206) $V_{LX}$ switching node voltage increases, for example when LS switch body-diode conduction does not occur. In scenario A, the increasing switching node voltage means that dV/dt is >0 and coil current is negative, such as inductor current $I_L$ 136 depicted in FIG. 2. In scenario B (208) $V_{LX}$ node voltage decreases, such as when the LS switch body diode is entering into conduction. As discussed above, the LS switch body diode entering into conduction indicates the LS switch is already OFF, i.e. LS switch M2, and HS switch M1 may be turned ON without causing cross conduction and damage to the power stage. The BDCD circuit may detect decreasing voltage, i.e. dV/dt<0, to determine when the body diode enters conduction.

Focusing on scenario B (208), the end of the LS switch conduction cycle may occur at the transition of the CMD_LS 108 (or G_LS 28) from low to high (202). The BDCD circuit, e.g. BDCD 100, may sample and store a voltage ($V_{HOLD}$) at this time (200). The sample time 202 for $V_{HOLD}$ is at the end of a first phase, indicated by (Di. The dead-time phase 230, also called non-overlap phase, is indicated by $\Phi_2$. Dead-time phase 230 ends when CMD_HS 106 (or G_HS 26) transitions from high to low, turning on HS switch M1. The techniques of this disclosure may allow a shorter dead-time phase 230 ($\Phi_2$) and therefore a more efficient circuit.

BDCD 100, of this disclosure, may compare $V_{LX}$ to the stored voltage 200 ($V_{HOLD}$) to detect when dV/dt<0, to determine when the body diode enters conduction. This relative voltage analysis means the inaccuracy associated with zero voltage level for external switches may not be relevant.

In some examples, BDCD 100 may also include an offset voltage 204, which arises from the turn-off delay of the low-side switch. This offset voltage may be useful to increase the noise immunity. In some examples, the techniques of this disclosure further increase this offset voltage 204 to further improve noise immunity. In other words, BDCD 100 may include an internal circuit to introduce a positive artificial offset, enabled during phase $\Phi_2$. The value of this offset is a programmable voltage and may improve noise immunity. Said otherwise, in some examples, BDCD 100 may detect the body diode conduction low voltage drop (e.g. below 1 mV). With the introduced positive offset 204, BDCD 100 may detect body diode conduction for voltage drops of some larger defined value, e.g. −10 mV or −50 mV. Offset 204 may delay detection of body diode conduction, but may introduce a safety factor to prevent possible false detection from noise. In this manner offset 204 may be a safety factor to prevent cross conduction and damage to power stage 34.

Note that CMD_LS transition from high to low (228) corresponds to the example of FIG. 2 with the HS switch M1 is PMOS and the LS switch M2 is NMOS. In other examples, such as a different configuration of power stage 34, CMD_LS may transition from low to high to indicate the end of the first phase $\Phi_1$. The example description of this disclosure, such as depicted by FIGS. 2-4, are just for illustration. Other similar circuits may use the techniques of this disclosure, such as cascode configured power stage, a power stage with both the HS switch and LS switch either PMOS or NMOS, and other examples.

Figure 5:
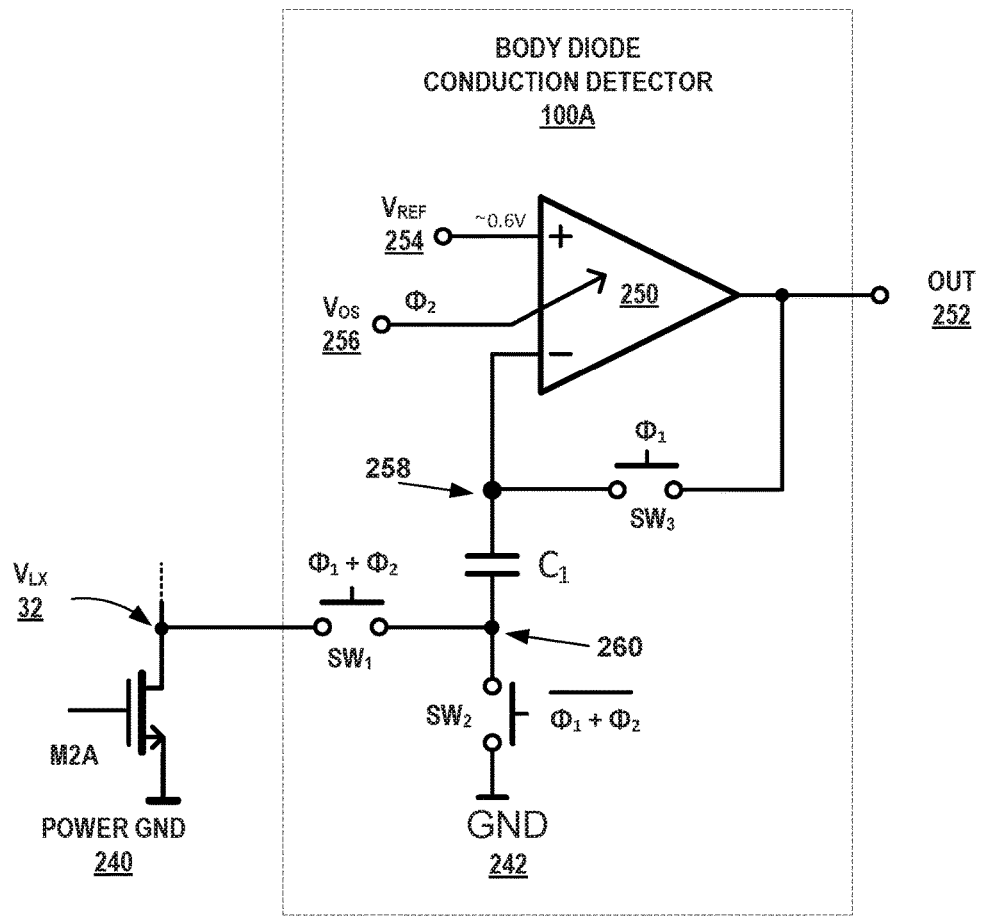
FIG. 5 is a schematic diagram of an example BDCD circuit in accordance with one or more techniques of this disclosure.

FIG. 5 is a schematic diagram of an example BDCD circuit in accordance with one or more techniques of this disclosure. For simplicity, the parasitic elements are not considered, and switches are considered as simple ideal switches. The example BDCD of FIG. 5 is only one possible example of an analog circuit implementation of a BDCD circuit of this disclosure. Other examples may include configurations or components, such as a digital circuit.

The example of FIG. 5 includes a portion of power stage 34 for illustration. The portion of power stage 34 includes switching node 32 ($V_{LX}$), LS switch M2A and power ground 240. Power ground 240 may connect to ground 242 via connections on a PCB, for example.

In the example of FIG. 5, the first portion of BDCD 100A includes operational amplifier 250 (op amp 250), which may be configured as a voltage follower or as a comparator. By closing switch 3 (SW3) during phase 1 ($\Phi_1$), the output of op amp 250 connects to the inverting input of op amp 250. Therefore, during phase 1, op amp 250 is configured as a voltage follower to track $V_{REF}$ 254, which connects to the non-inverting input of op amp 250. In some examples, $V_{REF}$ may be set to approximately 0.6V, but other values for $V_{REF}$ may be used.

BDCD 100 receives the switching node voltage $V_{LX}$ through switch 1 (SW1), which is also connected to a first node 260 of capacitor C1. Node 260 connects to ground 242 (GND 242) through switch 2 (SW2). A second node, 258 connects capacitor C1 to the inverting input of op amp 250 and to the output element of BDCD, 252, through SW3. Node 260 and node 258 may also be considered a first terminal and a second terminal of capacitor C1. The output element of BDCD, out 252, is the same as the output element of op amp 250. In some examples op amp 250 may also include an offset voltage input 256 ($V_{OS}$). Offset voltage input 256 corresponds to the predetermined offset 204 described above in relation to FIG. 4. Offset voltage input 256 ($V_{OS}$) may be applied during phase 2 ($\Phi_2$).

In operation, SW1 is closed during both phase 1 and phase 2. SW2 is open during both phase 1 and phase 2. SW3 is closed during phase 1 and open during phase 2. During phase 1, BDCD 100A operates as a track and hold circuit. This means, that SW1 is ON, feeding the $V_{LX}$ voltage to the plate (260) of sampling capacitor C1. SW3 is ON, therefore op amp 250 behaves as a voltage follower. The non-inverting input of op amp 250 is then equal to $V_{REF}$. As described above, the end of phase 1 is triggered by either CMD_LS or G_LS (see 228 of FIG. 4) at the end of LS switch conduction. The end of phase 1 triggers BDCD 100A to hold the voltage on capacitor C1. Accordingly, capacitor C1 stores information about $V_{DS}$ voltage of the low-side switch M2, according to the equation:

$$V_{C1} = V_{REF} - V_{DS\_LS} = V_{HOLD}$$

In other words, capacitor C1 is configured to store a voltage ($V_{HOLD}$) at the end of a first phase ($\Phi_1$). The stored voltage ($V_{HOLD}$) includes the sum of an input voltage ($V_{LX}$) plus a reference voltage $V_{REF}$. Stored voltage $V_{HOLD}$ may also store additional information, described in more detail below.

During the phase 2 ($\Phi_2$), SW3 is set off, and therefore configures op amp 250 to behave as comparator. Capacitor C1 stores value $V_{C1}$. $V_{C1} = V_{HOLD}$ as described above in relation to FIG. 4. Simultaneously with SW3 turning off, the falling edge of G_LS 28 is conducted into the gate of LS switch M2, and in a time 162 ($\tau$), depicted in FIG. 4, LS switch M2 is turned off, as indicated by body diode conduction and a decrease in $V_{LX}$. Depending on the inductor current polarity, switching-node 32 voltage $V_{LX}$ increases to $V_{DD}$ (for negative current in scenario A), or decreases to the body diode forward voltage (−Vf) as depicted in FIG. 4. In other words, op amp 250 is configured to follow the reference voltage $V_{REF}$ during phase 1. During phase 2, op amp 250 is configured as a comparator to compare a sum of the input voltage plus the stored voltage ($V_{LX} + V_{HOLD}$) to the reference voltage $V_{REF}$.

For scenario A, if $V_{LX}$ increases, the non-inverting input of the comparator (op amp 250) increases above $V_{REF}$, and the output of the comparator, out 252 switches to a logical LOW. In the opposite case, when body-diode enters into conduction, $V_{LX}$ gets more negative, at approximately time 162 ($\tau$), in the example of FIGS. 4 and 5. Therefore, node 258 drops below $V_{REF}$ and the output of the comparator, out 252 switches to a logical HIGH. The voltage at node 258 is $V_{HOLD} V_{LX}$. As described above, $V_{HOLD}$ is the stored voltage, which is the sum of $V_{LX} + V_{REF}$ at the sample time at the end of phase 1. Also note that $V_{LX}$ is approximately $V_{DS}$ of switch M2A. The relative voltage analysis compares the sum of $V_{HOLD}+V_{LX}$ to $V_{REF}$. Therefore, for the example of FIG. 5, in response to a magnitude of the sum of the input voltage ($V_{LX}$) plus the stored voltage ($V_{HOLD}$) being greater than the magnitude of the reference voltage ($V_{REF}$), toggle the output signal (out 252) of op amp 250 from a first logic level (LOW) to a second logic level (HIGH). In this example, op amp 250 is configured to toggle the output signal from LOW to HIGH in response to the sum of the input voltage plus the stored voltage ($V_{HOLD}+V_{LX}$) being more negative than the reference voltage ($V_{REF}$). Toggling out 252 from LOW to HIGH means that the body-diode of LS switch M2A is entering in conduction and HS switch M1 can be turned on.

In examples of BDCD 100A that include offset 256, the input ($V_{OS}$) may be a predefined positive offset voltage. The offset voltage may provide a safety margin for noise immunity, as described above in relation to FIG. 4. BDCD 100A, in response to the sum of the switching node voltage plus the stored voltage ($V_{HOLD}+V_{LX}$) plus the predefined positive offset voltage ($V_{OS}$) being more negative than reference voltage, ($V_{REF}$), op amp 250 may toggle the output signal from out 252 from LOW to HIGH. Also note that, as shown in FIGS. 3B and 4, the $V_{DS}$ voltage ($V_{LX}$) is increasing after sampling instant at the end of phase 1. This also adds a security margin into the detection threshold and may help improve the noise immunity.

The above description applies to the example of FIGS. 4 and 5. In other examples, a BDCD circuit of this disclosure may have other configurations. Some examples may include reversing the inverting and non-inverting inputs of op amp 250, connecting capacitor C1 to $V_{DD}$ via SW2, and other configurations.

Figure 7A:
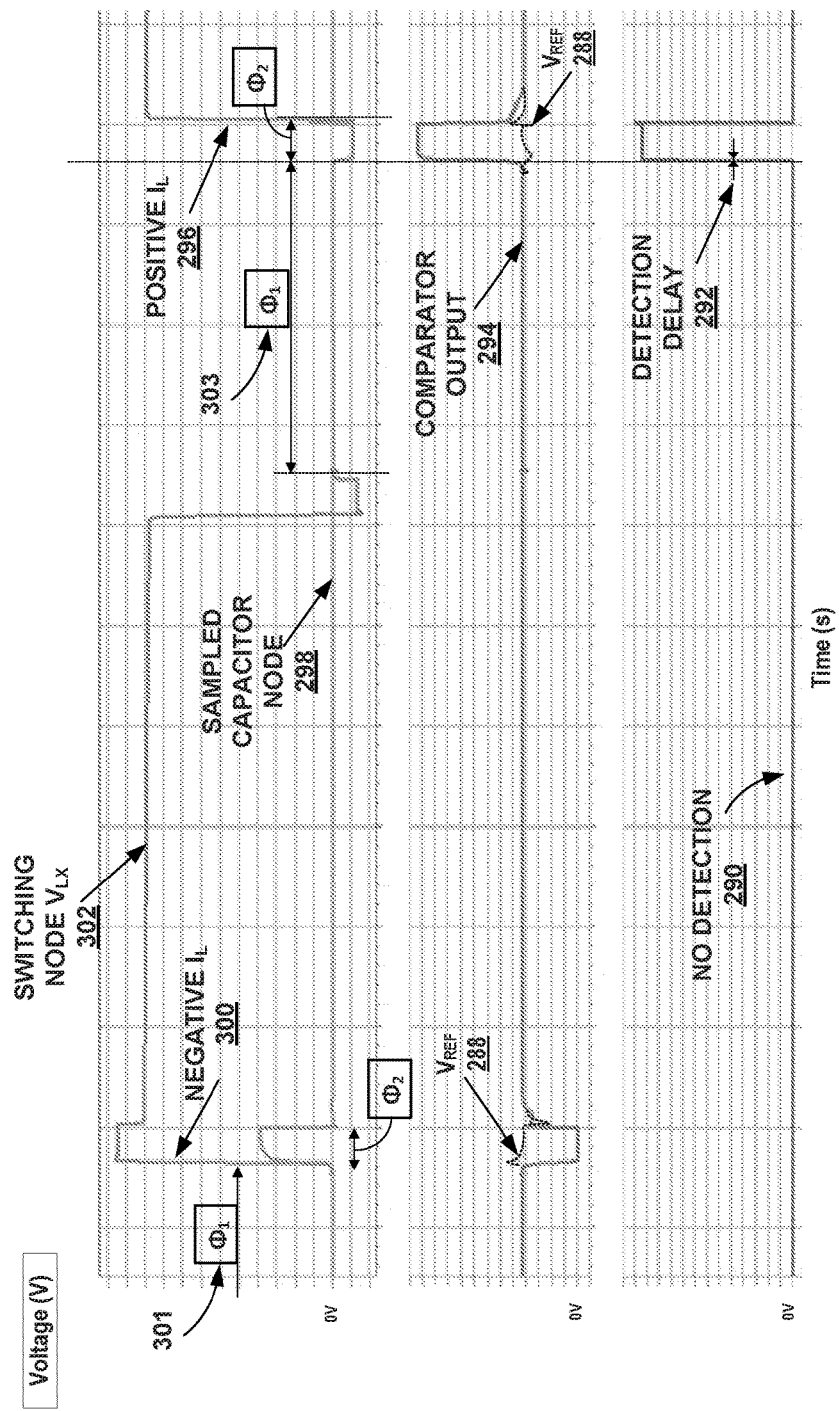
FIG. 7A is a timing graph illustrating example signals, ignoring parasitics, of an example BDCD circuit in accordance with one or more techniques of this disclosure.
Figure 7B:
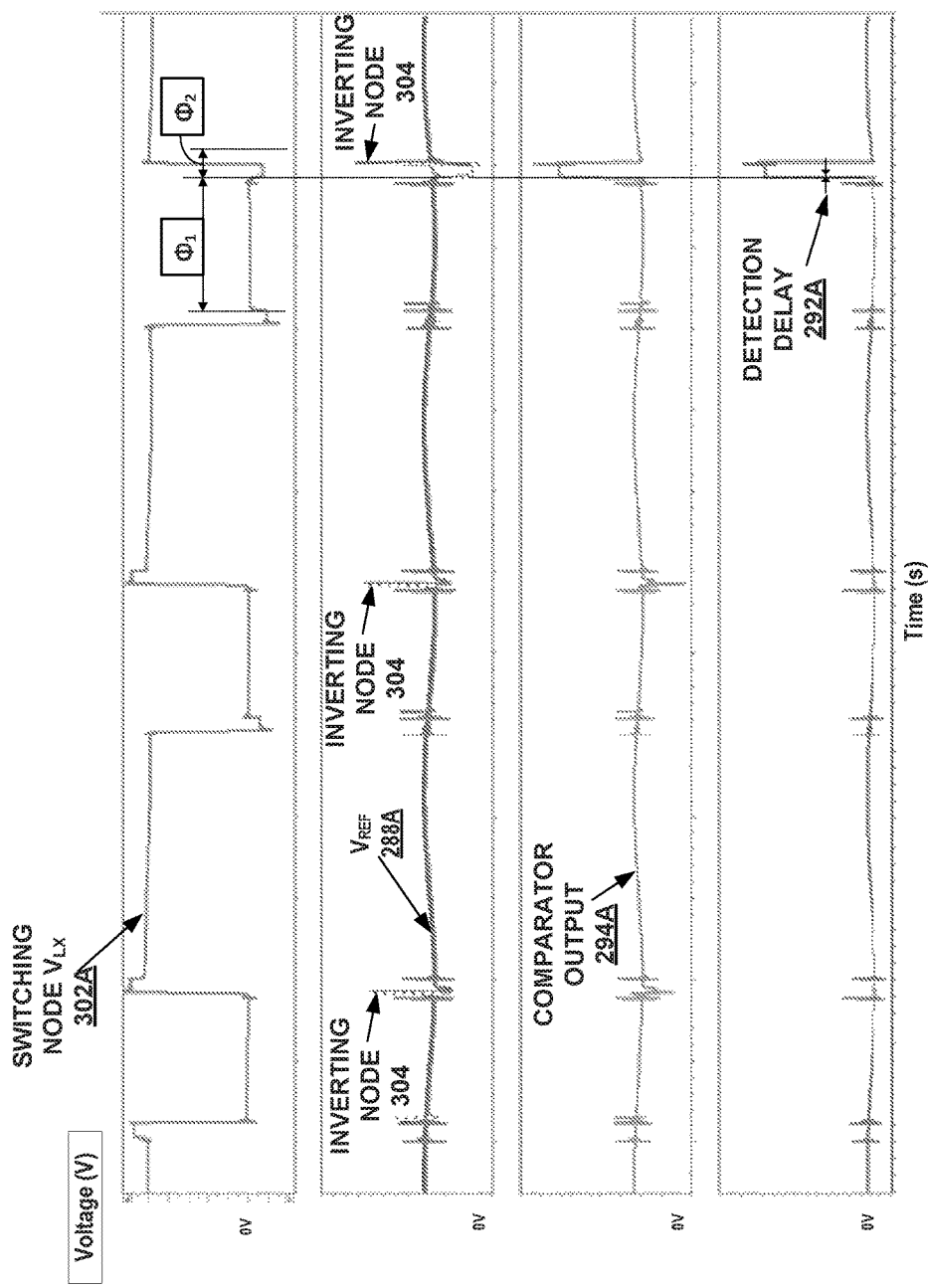
FIG. 7B is a timing graph illustrating example signals, including parasitics, of an example BDCD circuit in accordance with one or more techniques of this disclosure.

SW1 remain open during the remainder of the power stage switching cycle, e.g. after the end of phase 2 through the beginning of the next phase 1. The remainder of the power stage switching cycle may be considered a third phase ($\Phi_3$), in which SW1 disconnects node 260 from $V_{LX}$. SW2 and SW3 may be closed during the remainder of the power stage switching cycle. The remainder of the power stage switching cycle includes during HS switch conduction. The relationship between phase 1, phase 2 and the remainder of the power stage switching cycle may be seen in more detail as depicted in FIGS. 7A and 7B. During the remainder of the power stage switching cycle, e.g. when HS switch M1 conducts, $V_{LX} \approx V_{DD}$. With SW1 set off, and SW2 and SW3 on, the capacitor C1 is pre-biased to approximately equal $V_{REF}$ voltage.

The structure depicted in FIG. 5 may have advantages in that op amp 250 may be switched from a linear (pre-biased) voltage follower operation to a comparator mode. By pre-biasing capacitor C1 to approximately $V_{REF}$ means that the time response may be much faster than in other configurations. In some examples, the configuration of FIG. 5 may have body diode conduction detection in the nanosecond range (e.g. <3 ns), even with ordinary low-consumption operation amplifier components. Other body diode conduction detector circuits for external switches may have detection times as long as 30 ns or longer.

Other advantages may include insensitivity to manufacturing variation. An op amp, such as op amp 250 may have an inherent random offset because of manufacturing variation. However, this random offset of an op amp is the same for the voltage follower mode as the comparator mode. Therefore, any offset does not alter the body diode conduction detection. Similarly, any voltage drop across the parasitic resistances (bonding, PCB etc.) is also sampled and stored in capacitor C1. This makes the BDCD circuit 100A of FIG. 5 insensitive to the analog (on chip) GND level, which may vary because of process, materials, and similar circumstances. Also, during the non-overlapping period after the $V_{LX}$ falling edge, the plate of C1 connected to node 260 may be shorted to GND via SW2. This may keep the capacitor voltage ($V_{C1}$) more stable (e.g. constant) during operation.

In summary, the body diode conduction detector circuit of this disclosure overcomes constraints such as the undefined detection window, PCB and package parasitic elements (e.g. R, L, C) that may cause inaccurate measurements, and a requirement of a fast time response. By avoiding an absolute voltage measurement method and using a relative analysis of the switching node voltage the techniques of this disclosure may determine the sign of the derivative of $V_{LX}$ voltage. Therefore, a BDCD circuit of this disclosure may determine body diode conduction and reduce dead-time between conduction cycles of a HS switch and a LS switch of an SMPS. Though the example BDCD circuit of FIG. 5 provides certain advantages, as described herein, a BDCD circuit may be implemented in a variety of other configurations, including, for example as a processor, microcontroller, logic circuit or other implementation.

Figure 6:
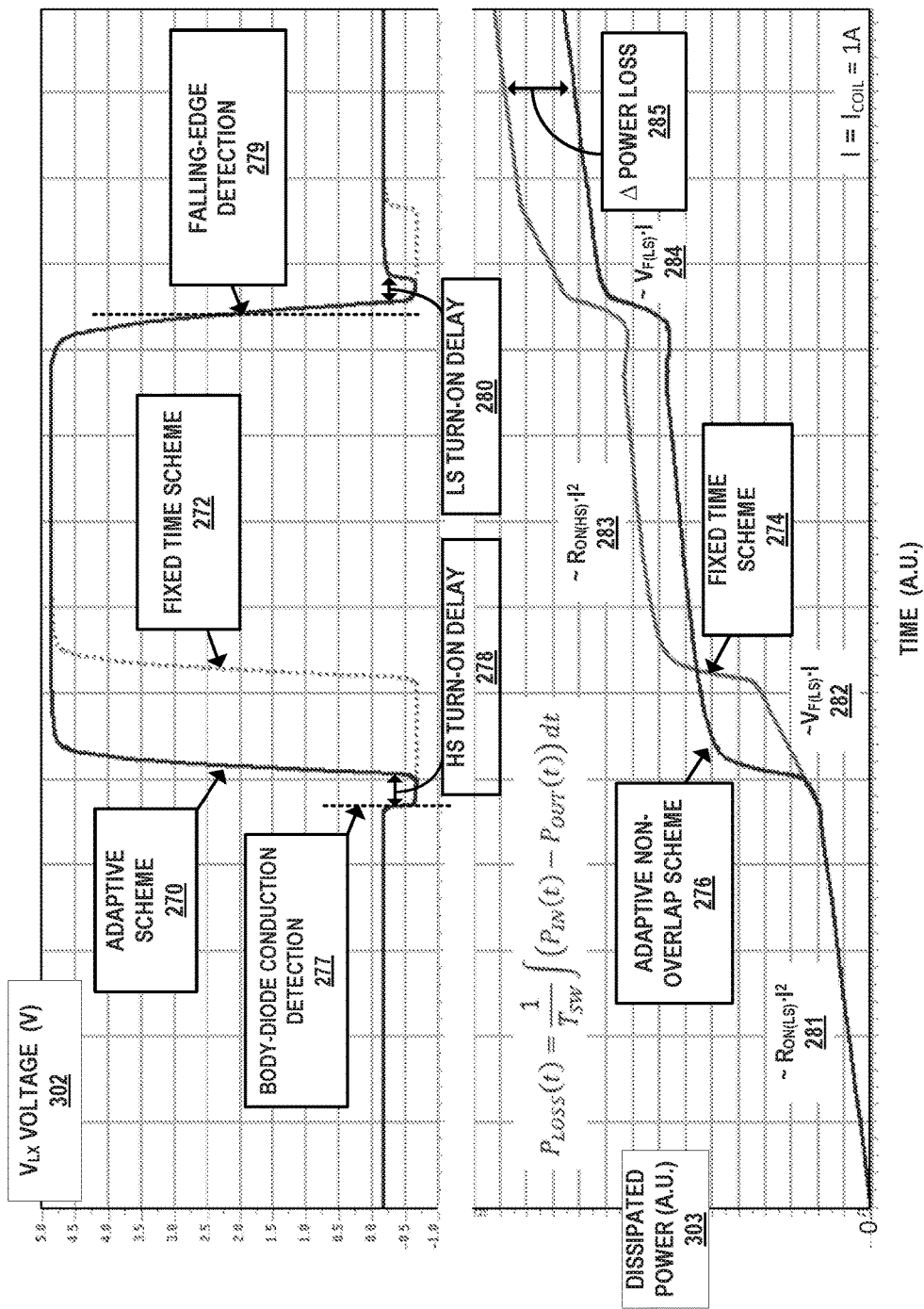
FIG. 6 is a timing graph illustrating the impact on power consumption of an adaptive timing scheme.

FIG. 6 is a timing graph illustrating the impact on power consumption of an adaptive timing scheme. Switching node voltage $V_{LX}$ curve 302 illustrates a complete switching cycle for HS switch conduction and LS switch conduction. FIG. 6 illustrates the impact on power consumption from reducing the dead-time after the falling edge of switching node voltage $V_{LX}$ and the impact from reducing the dead-time before HS switch M1 turns on. The falling edge of switching node voltage $V_{LX}$ corresponds to the anticipated LS switch turn 150 by inverter 105 as described in relation to FIGS. 2 and 3A.

The adaptive non-overlap scheme curve, 270, shows the point (277) at which the BDCD circuit determines the LS switch M2 body diode begins to conduct, indicating the LS switch is OFF. Control and driver circuit 20A may include a short HS switch turn-on delay 278. By comparison, the fixed time scheme curve 272 may include a much longer turn-on delay because of the open loop nature of the fixed time scheme. A fixed time scheme has no indication that the LS switch is actually off, so must include a comparatively longer dead-time, (aka non-overlap time) safety factor.

Similarly, as described above, a sensing circuit, such as may be included in control and driver circuit 20A may detect the falling edge 279 of $V_{LX}$ curve 302 indicating that HS switch M1 has turned off. The techniques of this disclosure may determine when the HS switch is off by monitoring the switching node voltage $V_{LX}$. Therefore, with the adaptive scheme 270, control and driver circuit 20A may include a comparatively shorter LS turn-on delay (280) than the fixed time scheme LS turn-on delay.

Power consumption curve 274 corresponds to fixed dead-time curve 272, while power consumption curve 276 corresponds to adaptive dead-time curve 270. The power loss, or dissipated power (303), may be described by the following equation:

$$P_{LOSS}(t) = \frac{1}{T_{SW}} \int (P_{IN}(t) - P_{OUT}(t))dt$$

The first portion 281 of both the adaptive scheme 276 and fixed time scheme 274 may correspond to the current through the drain-source resistance for the LS switch ($R_{ON(LS)} \times I^2$). The second portion 282 may correspond to the forward voltage drop of the LS switch body diode ($V_{F(LS)} \times$ I). The adaptive scheme 276 has a shorter time in the second portion 282 than does the fixed time scheme power curve 274. The third portion 283 may correspond to the drain-source resistance for the HS switch ($R_{ON(HS)} \times I^2$). The fourth portion 284 may correspond to the forward voltage drop of the HS switch body diode ($V_{F(HS)} \times I$). The power loss difference between the adaptive scheme 276 and the fixed time scheme power curve 274 is illustrated by 285.

With a fixed dead-time, or non-overlap time, as shown by curve 274, the power consumption is higher than that shown by curve 276. This simulation (using an example $I_{COIL}$ of 1A) illustrates that reducing the dead-time portions, for example, after HS switch conduction and before LS switch conduction, may reduce the overall power consumption of a SMPS. The techniques of this disclosure may reduce both the first and second dead-times, thereby reducing power consumption of an SMPS. Also, as described above, the techniques of this disclosure may have advantages over other types of SMPS control circuits, including use with both internal and external switches by monitoring the switching node voltage $V_{LX}$ of the power stage.

FIG. 7A is a timing graph illustrating example signals, ignoring parasitics, of an example BDCD circuit in accordance with one or more techniques of this disclosure. This simulation demonstrates simplified (no parasitics) behavior of the concept of the body-diode detector.

Figure 8:
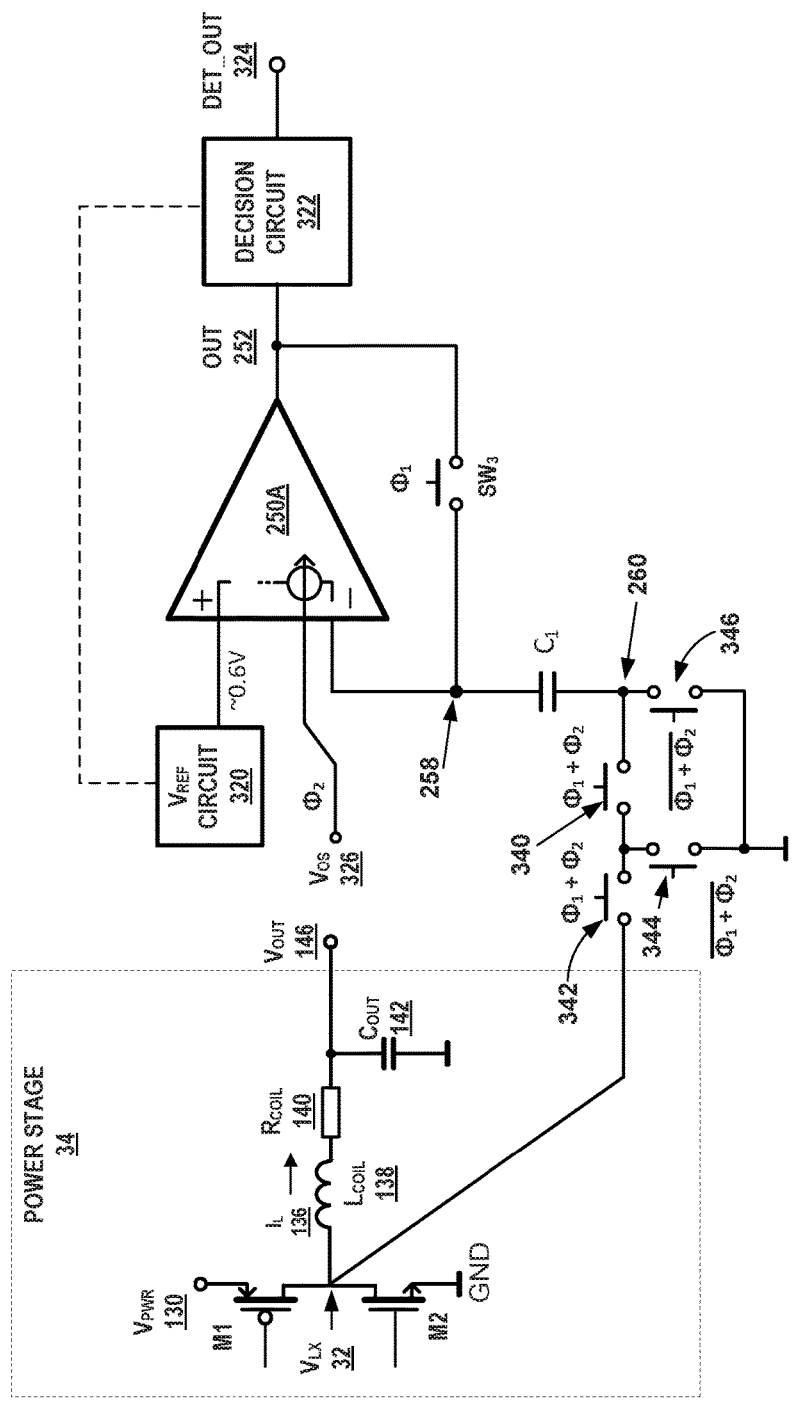
FIG. 8 is a schematic diagram illustrating an example implementation of a controller circuit that includes a matched $V_{REF}$ and decision level circuit, in accordance with one or more techniques of this disclosure.
Figure 9:
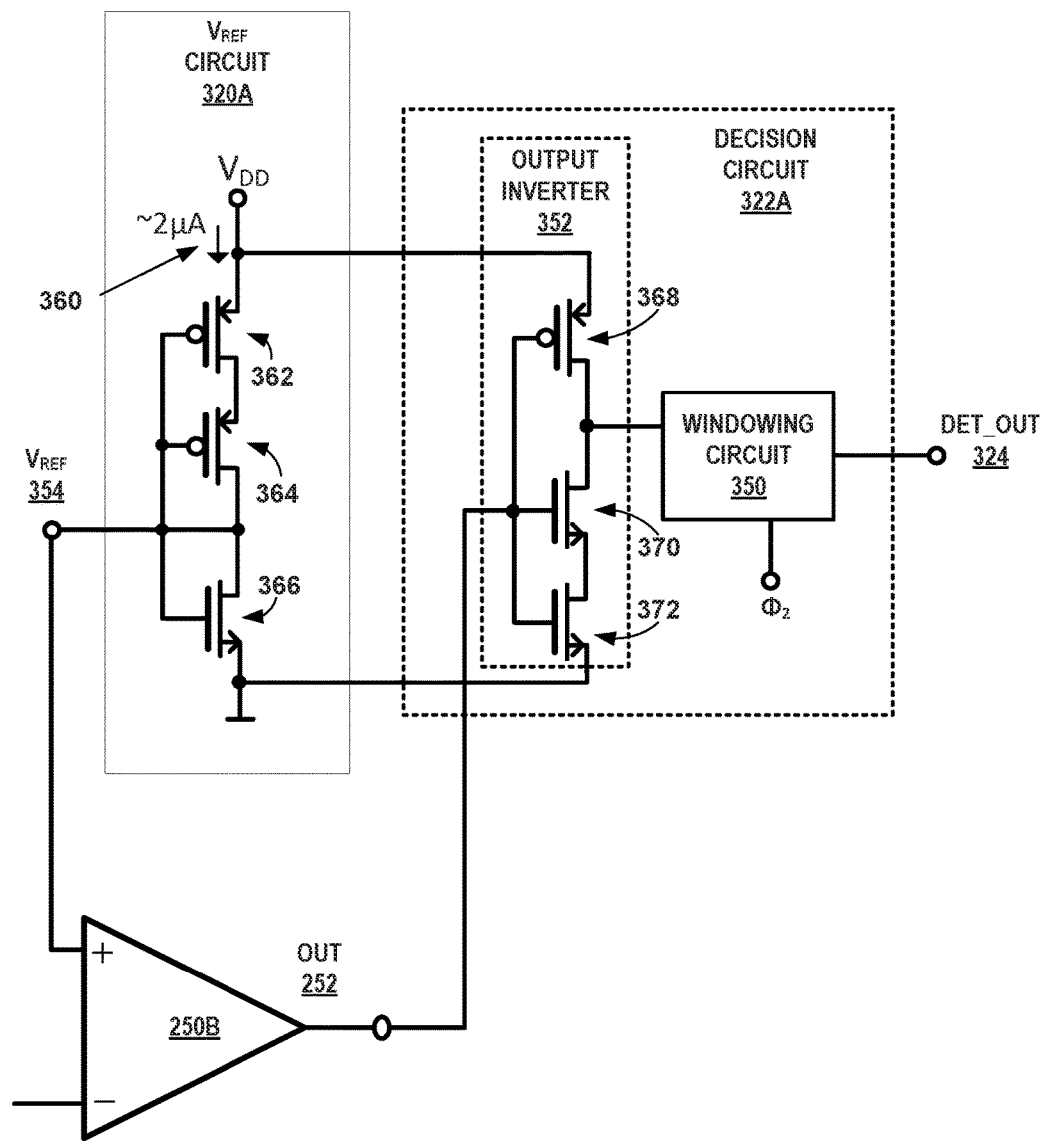
FIG. 9 is a schematic diagram illustrating details of an example matched $V_{REF}$ and decision level circuit, in accordance with one or more techniques of this disclosure.

FIG. 7A includes switching node $V_{LX}$ (302), sampled node 260 of the bottom plate of the capacitor C1 (298), reference voltage $V_{REF}$ (288), comparator output 294 and detector output 290. Comparator output 294 corresponds to OUT 252 and OUT 102 depicted in FIGS. 2 and 5. Detector output 290 corresponds to the output element of decision circuit 322, as depicted in FIGS. 8 and 9. For sake of clarity, the switching node waveform 302 contains one cycle with negative inductor current ($I_L$), and one cycle with positive inductor current. FIG. 7A also illustrates the relationship between phase 1 ($\Phi_1$), phase 2 ($\Phi_2$) and remainder of the power stage switching cycle may be considered a third phase ($\Phi_3$).

For the negative inductor current case, at the end of LS conduction phase $\Phi_1$ (301), the voltage $V_{LX}$, and thus also sampled node 260 of capacitor C1 (curve 298) increase. The comparator output 294 falls to zero.

For the positive inductor current case, as soon as the $V_{LX}$ node starts dropping towards the body-diode forward voltage (−Vf) at the end of $\Phi_1$ (303), the non-inverting input (node 258) of the comparator (op amp 250) starts simultaneously dropping below $V_{REF}$. As discussed above in relation to FIGS. 3A, 3B, 4 and 5, node 258 at the end of phase 1 and beginning of phase 2 is $V_{HOLD}$ $V_{LX}$. Consequently, comparator output 294 may rise to $V_{DD}$, or a logical HIGH. As discussed above in relation to FIG. 5, during phase 2, the comparator mode starts from pre-biased (unstable) state, and therefore the comparator generates an output from OUT 252 in very short time (approximately 0.5 ns-2 ns). The detection delay 292 provides a safety margin for noise immunity, as described above.

The simulation of the example of FIG. 7A demonstrates that a BDCD circuit, according to the techniques of this disclosure may function to detect body diode conduction for both the positive inductor current case and will not result in a false positive for the negative inductor current case.

FIG. 7B is a timing graph illustrating example signals, including parasitics, of an example BDCD circuit in accordance with one or more techniques of this disclosure. The example of FIG. 7B may evaluate the robustness of the BDCD circuit of this disclosure in a realistic application.

The simulation in the example of FIG. 7B includes a realistic PCB model containing non-ideal voltage supply, parasitic RLC on each supply wire, and also coupling RLC cells. As one example, in the example of FIG. 7B, overall GND instability was set to +/−1V during commutation.

FIG. 7B illustrates the behavior of the BDCD circuit of this disclosure over several switching cycles. The timing graph includes switching node voltage $V_{LX}$ (302A), inverting node of the comparator (304), $V_{REF}$ 288, and comparator output 294A. The example simulation in a noisy environment demonstrates that the BDCD circuit of this disclosure may provide stable results with slightly higher detection time that for the more simplified simulation of FIG. 7A that may ignore parasitics, noise or other similar factors. As described above, detection delay 292A may provide improved noise immunity. The simulation example of FIG. 7B also demonstrates that the BDCD circuit of this disclosure may be configured to avoid providing a false positive detection in a noisy environment and therefore avoid cross-conduction and potential damage to the power stage.

FIG. 8 is a schematic diagram illustrating an example implementation of a controller circuit that includes a matched $V_{REF}$ and decision level circuit, in accordance with one or more techniques of this disclosure. The example circuit of FIG. 8 may avoid an undefined logical output voltage that may generate a wrong detection of body diode conduction by the output inverter, such as output inverter 352 depicted in FIG. 9. Wrong detection may cause cross conduction causing damage of the output stage. In other words, the techniques of this disclosure, which include generating a $V_{REF}$ that is always lower than the switching point of the output inverter of decision circuit 322 avoids the risk of an undefined logic level.

In the example of FIG. 5, the output voltage at output element 252 may close to the switching point of an output inverter in the decision circuit. That is, during phase 1, the op amp output voltage may be an undefined logical state of neither a logical HIGH or LOW.

The circuit of FIG. 8 includes power stage 34, op amp 250A, $V_{REF}$ circuit 320, decision circuit 322, switch SW3, sampling capacitor C1 and an input switching network, which includes switches 340, 342, 344 and 346. The example circuit of FIG. 8 may be used with the BDCD circuit of this disclosure.

Power stage 34 is the same as power stage 34 described above in relation to FIG. 2, and is provided in FIG. 8 for clarity. $V_{REF}$ circuit 320 connects to the non-inverting input of op amp 250A. Decision circuit 322 connects to the output element 252 of op amp 250A and has an output element DET_OUT 324. As with FIG. 5, switch SW3 connects output element 252 to the inverting input of op amp 250A as well as node 258. Node 260 connects to switching node 32 through switches 340 and 342. Switches 340 and 342 are closed during phase 1 and phase 2. Capacitor C1 connects between nodes 260 and 258. Node 260 connects to ground through switch 346. Switch 344 connects the node between switches 342 and 340 to ground. Switches 344 and 346 are open during phase 1 and phase 2, similar to SW2 depicted in FIG. 5.

Op amp 250A may also include an offset voltage input 326. The interaction between $V_{REF}$ circuit 320 and decision circuit 322 is illustrated by FIG. 9. The output inverter of decision circuit 322 and reference generator may have with matched, but different, $V_{REF}$ and switching point voltages.

FIG. 9 is a schematic diagram illustrating details of an example matched $V_{REF}$ and decision level circuit, in accordance with one or more techniques of this disclosure. $V_{REF}$ circuit 320A and decision circuit 322A correspond to $V_{REF}$ circuit 320 and decision circuit 322 depicted in FIG. 8.

In the example of FIG. 9, the reference voltage $V_{REF}$ is generated by of "linearized" inverter, i.e. inverter with interconnected input/output. $V_{REF}$ circuit 320A includes PMOS transistors 362 and 364 and NMOS transistor 366. The source of transistor 362 connects to $V_{DD}$, the drain of transistor 362 connects to the source of transistor 364. The drain of transistor 364 connects to the drain of transistor 366. The drain of transistor 366 connects to ground. All the gates of transistors 362-366 connect to each other as well as to the drains of transistors 364 and 366. The drains of transistors 364 and 366 output $V_{REF}$, which connects to the non-inverting input of op amp 250B. In some examples, the drain-source current of transistors 362-366 may be approximately 2 µA (360).

Decision circuit 322A includes output inverter 352 and windowing circuit 350. Windowing circuit 350 is enabled during phase 2 ($\Phi_2$) and connects to the decision circuit output DET_OUT 324. The input of windowing circuit 350 connects to drains of PMOS transistor 368 and NMOS transistor 370. The source of transistor 368 connects to $V_{DD}$. The source of transistor 370 connects to the drain of NMOS transistor 372. The source of transistor 372 connects to ground. The gates of transistors 368-372 connect together and to the output element 252 of op amp 250B.

By cascading two weak PMOS devices in $V_{REF}$ circuit 320A, $V_{REF}$ is dominated by a large W/L of NMOS transistor 366. A weak PMOS device may be implemented with a low W/L ratio. Similarly, the trigger point of output inverter 352 of decision circuit 322A is mainly determined by a strong $g_m$ of PMOS transistor 368, while two weak stacked NMOS transistors 370 and 372 have a low impact to the switching point. In this manner, the switching point (aka trigger point) of output inverter 352 is always higher than the reference voltage $V_{REF}$, which may provide a more reliable detection when connected to the BDCD circuit of this disclosure.

Figure 10:
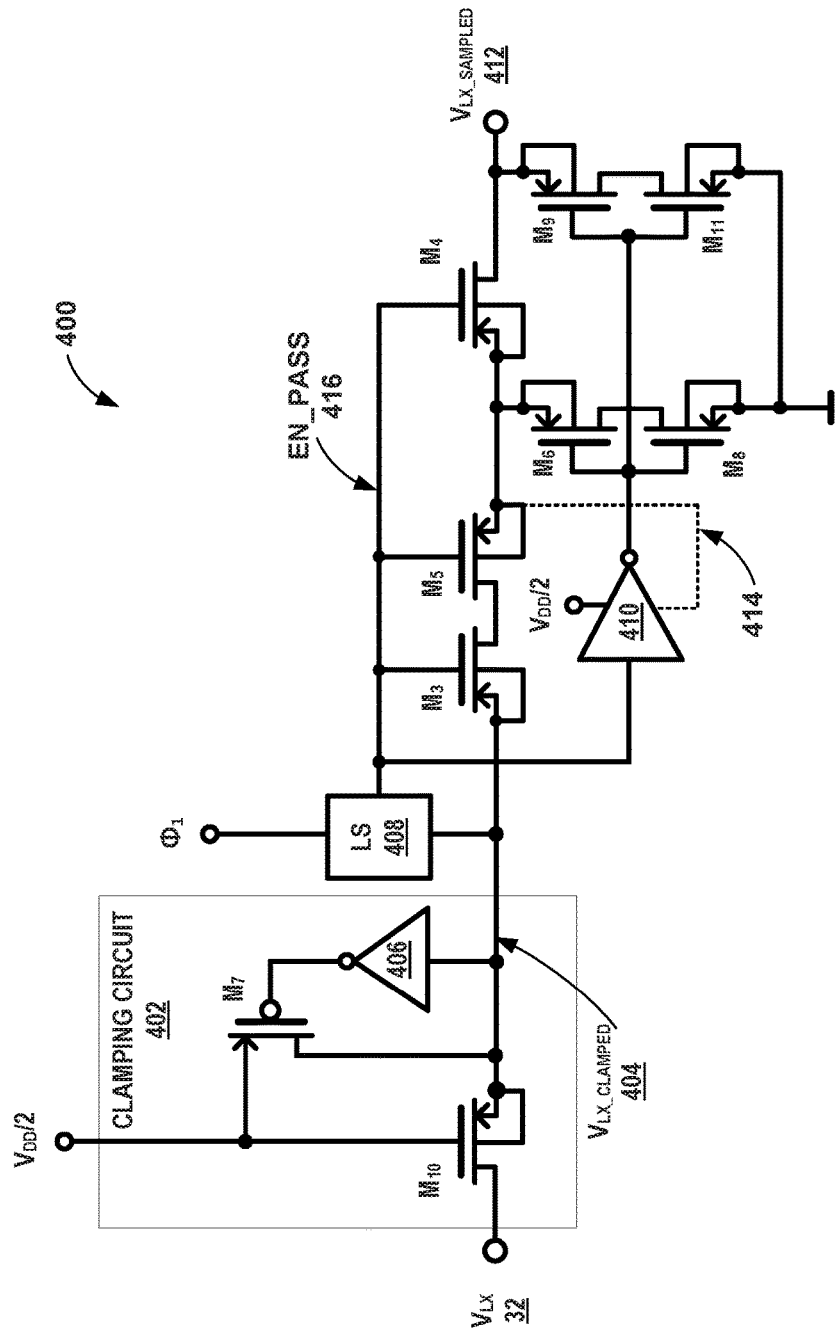
FIG. 10 is a schematic diagram illustrating an example controller circuit that includes an input switch with negative $V_{LX}$ voltage handling capability and high dv/dt voltage transition immunity.

FIG. 10 is a schematic diagram illustrating an example controller circuit that includes an input switch with negative $V_{LX}$ voltage handling capability and high dv/dt voltage transition immunity. The circuit implementation of FIG. 5 may have a high voltage range of the switching node 32 ($V_{LX}$). In some examples, the voltage range may exceed the GND-$V_{DD}$ headroom during a transient instant. FIG. 10 is an example implementation of analog sampling input switch SW1 depicted in FIG. 5 that may mitigate issues that result from the high voltage range. Switch circuit 400 is a double cascaded switch, providing high isolation rate, which may be beneficial for the sensitive input circuit of the detector, such as the BDCD circuit depicted in FIGS. 2 and 5.

Example switch circuit 400 includes an input stage of clamping circuit 402, as well as level shifter 408 and dedicated voltage switches implemented in back-to-back configuration. Switch circuit 400 may sustain high negative voltage, enabled also in static condition, and also high dV/dt transition of switching node 32. A static condition is a condition where, for example, the negative voltage is constantly present. The opening and closing of switch circuit 400 may be controlled by following the value of driving signal for phase 1, e.g. CMD_LS or G_LS (228) as described above in relation to FIG. 4.

Clamping circuit 402 includes transistor M10, transistor M7 and inverter 406. The drain of NMOS transistor M10 connects to switching node 32 and monitors voltage $V_{LX}$. The source of transistor M10 connects to the drain of PMOS transistor M7. The source of transistor M7 connects to the gate of transistor M10 and to the power supply. In the example of switch circuit 400, the power supply may be half of $V_{DD}$, or $V_{DD}/2$. The gate of transistor M7 connects to the output of inverter 406. The input of inverter 406 connects to the source of transistor M10 and to level shifter 408. In this example, clamping circuit 402 limits the $V_{LX}$ CLAMPED signal (404) to +$V_{DD}/2$. This extends the voltage range of the transistors in switch circuit 400 by factor of two.

Level shifter 408 connects to the phase 1 driving signal ($\Phi_1$), as well as the source of transistor M3. Level shifter 408 also connects to the gates of transistors M3, M5 and M4 at the same node which connects to the input of inverter 410. The drain of transistor M3 connects to the drain of transistor M5. The source of transistor M5 connects to the source of transistor M4. The drain of transistor M4 connects to the output 412 of switch circuit 400, as well as to the source of transistor M9.

The drain of transistor M9 connects to the drain of transistor M11. The source of transistor M11 connects to ground. The source of transistor M6 connects to the sources of transistors M5 and M4. The drain of transistor M6 connects to the drain of transistor M8. The source of transistor M8 connects to ground. The gates of transistors M6, M8, M9 and M11 connect to the output of inverter 410. The input voltage for inverter 410 is +$V_{DD}/2$, and the ground or $V_{SS}$ of inverter 410 connects to the source of transistors M4, M5 and M8 (414). The input level-shifter LS 408 accurately drives the transistors of input switch circuit 400 for whole (negative) voltage range. Additionally, the dedicated voltage switches M3-M6, M8, M9 and M11 were implemented in back-to-back configuration, allowing reliable handling of negative voltage.

The techniques of this disclosure use the relative measurement of the switching-node voltage $V_{LX}$, instead of an absolute DC voltage measurement. The example BCDC circuit is based on a tracking and hold circuit. The BDCD circuit may include specific timing which to configure the operational amplifier as voltage follower during track and hold phase, and as comparator during the detection phase. The techniques of this disclosure may provide advantages that include body-diode conduction detection accuracy and speed, and immunity against PCB and bonding parasitic elements. Other advantages may include improved conversion efficiency, and therefore reducing heat dissipation; simplified configuration of the driver/converter because of reduced number of registers, when compared to other power transistor status detection circuits. Additionally, a control and driver circuit that includes a BDCD circuit of this disclosure may enable easier selection and replacement of external components because of to self-tuning of driver timings i.e. dead times.

Figure 11:
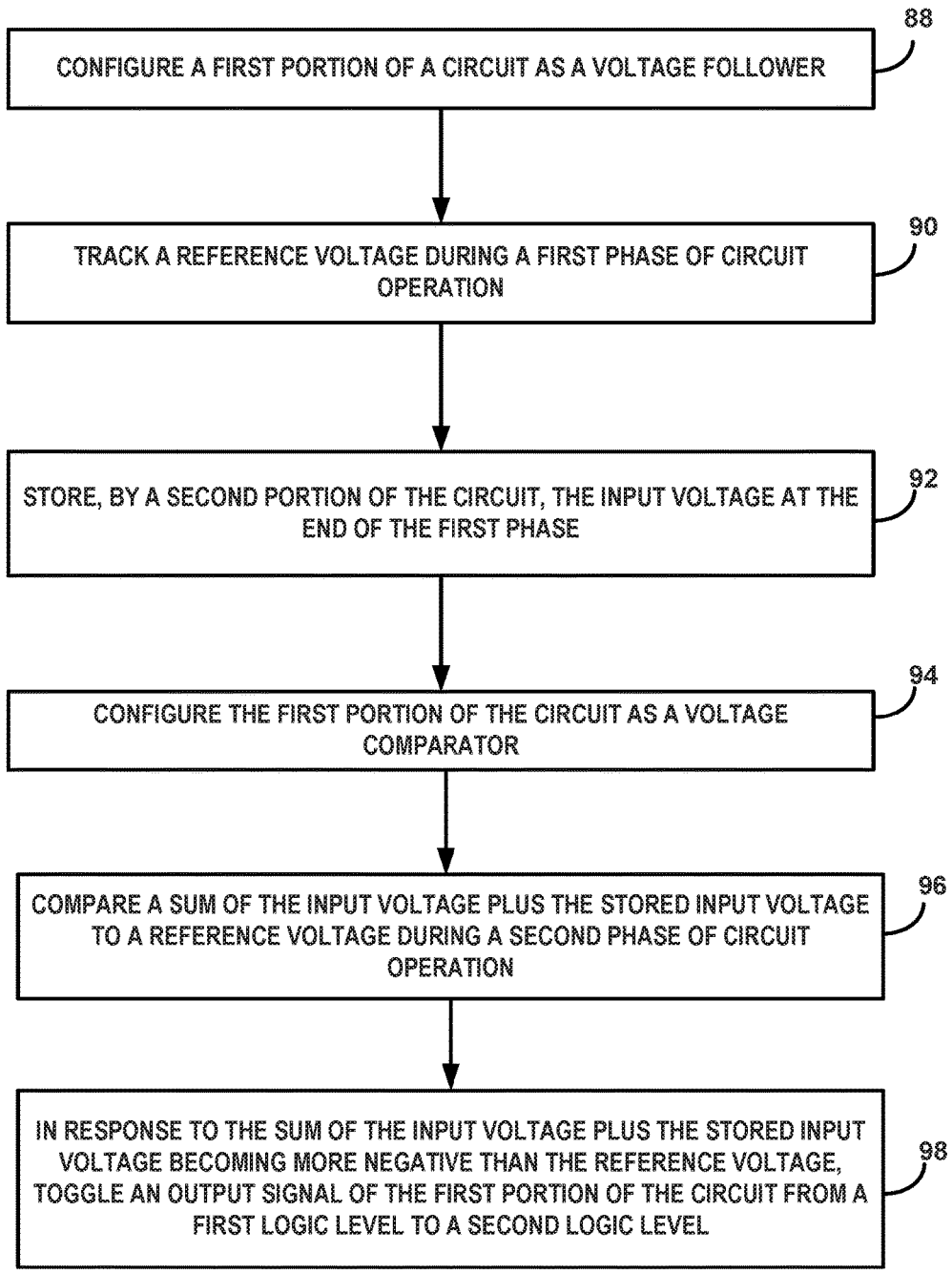
FIG. 11 is a flow chart illustrating the operation of a BDCD circuit in accordance with one or more techniques of this disclosure.

FIG. 11 is a flow chart illustrating the operation of a BDCD circuit in accordance with one or more techniques of this disclosure. The operation of the BDCD circuit will be described in terms of FIG. 5, unless otherwise noted.

During the LS switch conduction phase ($\Phi_1$) SW3 may close, configuring op amp 250 as a voltage follower (88). Op amp 250 and SW3 may be considered a first portion of BDCD circuit 100A. Following $V_{REF}$ may pre-bias op amp 250 of BDCD circuit 100A by tracking $V_{REF}$ 254 (90) and causing node 258 to approximately equal $V_{REF}$. During phase 1, SW1 is ON, feeding the $V_{LX}$, the voltage of node switching 32 to one plate (260) of sampling capacitor C1.

At the end of phase 1, which is triggered by either CMD_LS 108 or G_LS 28, depicted in FIGS. 2 and 4, BDCD circuit 100A stores the voltage on capacitor C1 (92), which may be considered a second portion of BDCD circuit 100A. The stored voltage, $V_{HOLD}$, is the sum of $V_{LX}+V_{REF}$ at the sample time.

Also at the end of phase 1, BDCD circuit 100A may configure op amp 250 as a comparator by opening SW3 (94). As a comparator during phase 2 (12), op amp 250 may be configured to compare the sum of the input voltage $V_{LX}$ plus the stored voltage $V_{HOLD}$ at the inverting input 258 to $V_{REF}$ 254 at the non-inverting input (96). This is a relative analysis technique, as described above, that BDCD circuit 100A may use to determine the sign of the derivative of $V_{LX}$ without the need for an absolute voltage measurement. By determining sign of the derivative of $V_{LX}$ BDCD circuit 100A may determine when the body diode of a power transistor such as LS switch M1 begins to conduct. By determining body diode conduction, BDCD 100A may determine the status of the power transistor, e.g. if the power transistor is conducting (ON) or OFF. Therefore, a BDCD circuit 100A reduce dead-time between conduction cycles of a HS switch and a LS switch of an SNIPS.

In response to the sum of the stored voltage plus the input voltage ($V_{HOLD}+V_{LX}$) being more negative than the reference voltage $V_{REF}$, toggling the output signal 252 of op amp 250, the first portion of the circuit, from a first logic level to a second logic level (98). In the example of FIG. 5, when $V_{HOLD}+V_{LX}$ becomes more negative than $V_{REF}$, op amp 250 toggles from a logical LOW to logical HIGH.

In one or more examples, the functions described above may be implemented in hardware, software, firmware, or any combination thereof. For example, the various components of FIGS. 1 and 5 may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media, may comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein, may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Example 1

A circuit comprising: a capacitor configured to store a voltage at the end of a first phase, wherein the stored voltage comprises a sum of an input voltage plus a reference voltage, and an operational amplifier configured to: follow the reference voltage during the first phase, compare a sum of the input voltage plus the stored voltage to the reference voltage during a second phase, and in response to a magnitude of the sum of the input voltage plus the stored voltage being greater than the magnitude of the reference voltage, toggle an output signal of the operational amplifier from a first logic level to a second logic level.

Example 2

The circuit of example 1, wherein the operational amplifier is configured to toggle the output signal from the first logic level to the second logic level in response to the sum of the input voltage plus the stored voltage being more negative than the reference voltage.

Example 3

The circuit of any of examples 1-2 or any combination thereof, wherein the input voltage is a switching node voltage of a power stage for a switched mode power supply.

Example 4

The circuit of any combination of examples 1-3, wherein the second logic level indicates conduction of a body diode of a first switch of the power stage.

Example 5

The circuit of any combination of examples 1-4, wherein the output signal of the operational amplifier controls a dead-time of the power stage.

Example 6

The circuit of any combination of examples 1-5, further comprising a first switch, wherein closing the first switch configures the operational amplifier as a voltage follower; and opening the first switch configures the operational amplifier as a comparator.

Example 7

The circuit of any combination of examples 1-6, wherein the capacitor comprises a first terminal and a second terminal, wherein the first terminal of the capacitor connects to the input voltage, wherein the second terminal of the capacitor connects to an inverting input of the operational amplifier, and wherein the reference voltage connects to a non-inverting input of the operational amplifier.

Example 8

The circuit of any combination of examples 1-7, further comprising a second switch, wherein the second switch connects the input voltage to the first terminal of the capacitor during the first phase and the second phase; and the second switch disconnects the first terminal of the capacitor from the input voltage during a third phase.

Example 9

The circuit of any combination of examples 1-8, further comprising a third switch, wherein the third switch connects the first terminal of the capacitor to ground during a third phase, and the third switch disconnects the first terminal of the capacitor from ground during the first phase and the second phase.

Example 10

The circuit of any combination of examples 1-9, further comprising an offset voltage input, wherein the offset voltage input: is a programmable voltage, delays the toggle of the output signal from the first logic level to the second logic level during the second phase.

Example 11

A method comprising: configuring a first portion of a circuit as a voltage follower, wherein an output signal at an output element of the first portion of the circuit is configured to track a reference voltage, tracking the reference voltage during a first phase of circuit operation, wherein the first phase comprises a beginning and an end, storing, by a second portion of the circuit at the end of the first phase, a voltage, wherein the stored voltage comprises the sum of an input voltage plus the reference voltage. During a second phase of circuit operation: configuring the first portion of the circuit as a voltage comparator, wherein the output signal at the output element of the first portion of the circuit comprises a plurality of logic levels, comparing a sum of the stored voltage plus the input voltage to the reference voltage, in response to the sum of the stored voltage plus the input voltage being more negative than the reference voltage, toggling the output signal of the first portion of the circuit from a first logic level to a second logic level.

Example 12

The method of example 11, wherein the first portion of the circuit comprises an operational amplifier, and wherein configuring the first portion of the circuit as a voltage follower comprises closing a switch connecting the output element to an inverting input element of the operational amplifier.

Example 13

The method of any combination of examples 11-12, wherein configuring the first portion of the circuit as a voltage comparator comprises: opening the switch; and receiving the sum of the input voltage plus the stored voltage at the inverting input element of the operational amplifier.

Example 14

The method of any combination of examples 11-13, wherein the input voltage is a switching node voltage of a power stage for a switched mode power supply.

Example 15

The method of any combination of examples 11-14, wherein the second logic level indicates conduction of a body diode of a first switch of the power stage.

Example 16

The method of any combination of examples 11-15, wherein the output signal of the operational amplifier controls a dead-time of the power stage.

Example 17

A system comprising: a controller circuit configured to drive a power stage of a switched mode power supply. The controller circuit comprising: a driver element configured to drive at least one switch of the power stage, a body diode conduction detector (BDCD) circuit comprising: a capacitor configured to store a voltage at the end of a first phase, wherein the stored voltage comprises the sum of a reference voltage plus a switching node voltage of the power stage. The system further comprises an operational amplifier configured to: during the first phase, follow the reference voltage. During a second phase: compare the sum of the stored voltage plus the switching node voltage to the reference voltage, and in response to the sum of the switching node voltage plus the stored voltage being more negative than the reference voltage, toggle an output signal of the operational amplifier from a first logic level to a second logic level.

Example 18

The system of example 17, wherein the operational amplifier is further configured to receive a predefined positive offset voltage, wherein in response to the sum of the switching node voltage plus the stored voltage plus the predefined positive offset voltage being more negative than reference voltage, toggle an output signal of the operational amplifier from a first logic level to a second logic level.

Example 19

The system of any combination of examples 17-18, further comprising a dead-time generator circuit, wherein the output signal of the operational amplifier controls the dead-time generator circuit.

Example 20

The system of any combination of examples 17-19, wherein the power stage is implemented on a first integrated circuit (IC) and the controller circuit is implemented on a second IC separate from the first IC.

Various examples of the disclosure have been described. These and other examples are within the scope of the following claims.

The invention claimed is:

1. A circuit comprising:
   a first switch;
   a capacitor configured to store a voltage at an end of a first phase,
     wherein the capacitor comprises a first terminal and a second terminal;
     wherein the first switch connects the first terminal of the capacitor to an input voltage during the first phase and a second phase, and
     wherein the stored voltage comprises a sum of the input voltage at the end of the first phase plus a reference voltage; and
   an operational amplifier comprising an inverting input terminal, a non-inverting input terminal and an output terminal,
     wherein the second terminal of the capacitor connects to the inverting input terminal, and
     wherein the reference voltage connects to the non-inverting input of the operational amplifier, the operational amplifier configured to:
       compare a sum of the input voltage plus the stored voltage to the reference voltage during a second phase, wherein the input voltage is changing during the second phase; and
       in response to a magnitude of the sum of the input voltage plus the stored voltage being greater than the magnitude of the reference voltage, toggle an output signal of the operational amplifier from a first logic level to a second logic level, wherein the first switch disconnects the first terminal of the capacitor from the input voltage during a third phase.

2. The circuit of claim 1, wherein the operational amplifier is configured to toggle the output signal from the first logic level to the second logic level in response to the sum of the input voltage plus the stored voltage being more negative than the reference voltage.

3. The circuit of claim 1, wherein the input voltage is a switching node voltage of a power stage for a switched mode power supply.

4. The circuit of claim 3, wherein the second logic level indicates conduction of a body diode of a first switch of the power stage.

5. The circuit of claim 3, wherein the output signal of the operational amplifier controls a dead-time of the power stage.

6. The circuit of claim 1, further comprising a second switch, wherein:
   closing the second switch configures the operational amplifier as a voltage follower, wherein the second switch connects output terminal to the inverting input terminal; and
   opening the second switch configures the operational amplifier as a comparator.

7. The circuit of claim 6, further comprising a third switch, wherein:
   the third switch connects the first terminal of the capacitor to ground during the third phase; and
   the third switch disconnects the first terminal of the capacitor from ground during the first phase and the second phase.

8. The circuit of claim 1, wherein the operational amplifier is further configured to receive an offset voltage input, wherein the offset voltage input:
   is a programmable voltage;
   delays the toggle of the output signal from the first logic level to the second logic level during the second phase.

9. A method comprising:
   configuring a first portion of a circuit as a voltage follower, wherein an output signal at an output terminal of the first portion of the circuit is configured to track a reference voltage;
   tracking the reference voltage during a first phase of circuit operation, wherein the first phase comprises a beginning and an end;
   storing, by a second portion of the circuit at the end of the first phase, a voltage on a capacitor, wherein the stored voltage on the capacitor comprises a sum of an input voltage at the end of the first phase plus the reference voltage,
     wherein the capacitor comprises a first terminal and a second terminal,
     wherein a first switch connects the first terminal of the capacitor to an input voltage during the first phase and a second phase; and
   during the second phase of circuit operation:
     configuring the first portion of the circuit as a voltage comparator, wherein the output signal at the output terminal of the first portion of the circuit comprises a plurality of logic levels;
     comparing a sum of the stored voltage plus the input voltage to the reference voltage, wherein the input voltage is changing during the second phase;
   in response to the sum of the stored voltage plus the input voltage being more negative than the reference voltage, toggling the output signal of the first portion of the circuit from a first logic level to a second logic level; and
   disconnecting, by the first switch, the first terminal of the capacitor from the input voltage during a third phase.

10. The method of claim 9,
    wherein the first portion of the circuit comprises an operational amplifier,
    wherein the reference voltage connects to a non-inverting input of the operational amplifier, and
    wherein configuring the first portion of the circuit as a voltage follower comprises closing a second switch connecting the output terminal to an inverting input terminal of the operational amplifier.

11. The method of claim 10, wherein configuring the first portion of the circuit as a voltage comparator comprises:
    opening the second switch; and receiving the sum of the input voltage plus the stored voltage on the capacitor at the inverting input element of the operational amplifier, wherein the second terminal of the capacitor connects to the inverting input terminal of the operational amplifier.

12. The method of claim 9, wherein the input voltage is a switching node voltage of a power stage for a switched mode power supply.

13. The method of claim 12, wherein the second logic level indicates conduction of a body diode of a first switch of the power stage.

14. The method of claim 12, wherein the output signal of the operational amplifier controls a dead-time of the power stage.

15. A system comprising a controller circuit configured to drive a power stage of a switched mode power supply, the controller circuit comprising:
 a driver element configured to drive at least one switch of the power stage;
 a body diode conduction detector (BDCD) circuit comprising:
  a first switch;
  a capacitor configured to store a voltage at an end of a first phase,
   wherein the capacitor comprises a first terminal and a second terminal;
   wherein the stored voltage comprises a sum of a reference voltage plus a switching node voltage of the power stage at the end of the first phase, and
   wherein the first switch connects the first terminal of the capacitor to the switching node voltage during the first phase and a second phase and the first switch disconnects the first terminal of the capacitor from the input voltage during a third phase; and
  an operational amplifier comprising an inverting input terminal, a non-inverting input terminal and an output terminal, wherein the second terminal of the capacitor connects to the inverting input terminal, and wherein the reference voltage connects to a non-inverting input of the operational amplifier, the operational amplifier configured:
   as a voltage follower during the first phase, wherein a second switch connects the output terminal to the inverting input terminal during the first phase; and
   as a comparator during a second phase, wherein the second switch disconnects the output terminal from the inverting input terminal during the second phase, the operational amplifier configured to:
    compare a sum of the stored voltage plus the switching node voltage to the reference voltage, wherein the switching node voltage is changing during the second phase; and
    in response to the sum of the switching node voltage plus the stored voltage being more negative than the reference voltage, toggle an output signal of the operational amplifier from a first logic level to a second logic level.

16. The system of claim 15, wherein the operational amplifier is further configured to receive a predefined positive offset voltage, wherein in response to the sum of the switching node voltage plus the stored voltage plus the predefined positive offset voltage being more negative than reference voltage, toggle the output signal of the operational amplifier from a first logic level to a second logic level.

17. The system of claim 15, further comprising a dead-time generator circuit, wherein the output signal of the operational amplifier controls the dead-time generator circuit.

18. The system of claim 15, wherein the power stage is implemented on a first integrated circuit (IC) and the controller circuit is implemented on a second IC separate from the first IC.

* * * * *